(12) United States Patent
Yamasaki et al.

(10) Patent No.: US 8,066,862 B2
(45) Date of Patent: Nov. 29, 2011

(54) MANUFACTURING METHOD OF WIRING BOARD

(75) Inventors: Tomoo Yamasaki, Nagano (JP); Katsuya Fukase, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 544 days.

(21) Appl. No.: 12/324,916

(22) Filed: Nov. 28, 2008

(65) Prior Publication Data

US 2009/0188806 A1    Jul. 30, 2009

(30) Foreign Application Priority Data

Jan. 30, 2008   (JP) .................................. 2008-019261

(51) Int. Cl.
*C25D 5/02*    (2006.01)
(52) U.S. Cl. ...................................................... 205/125
(58) Field of Classification Search .................. 205/125, 205/222, 223; 438/618, 627
See application file for complete search history.

(56) References Cited

U.S. PATENT DOCUMENTS

| | | | | |
|---|---|---|---|---|
| 6,642,136 B1 * | 11/2003 | Lee et al. | ...... | 438/613 |
| 7,012,019 B2 * | 3/2006 | Hsu et al. | ...... | 438/618 |
| 7,199,036 B2 * | 4/2007 | Chan et al. | ...... | 438/613 |
| 2002/0177006 A1 * | 11/2002 | Clothier et al. | ...... | 428/596 |
| 2006/0022304 A1 * | 2/2006 | Rzeznik | ...... | 257/532 |
| 2006/0202331 A1 * | 9/2006 | Hu | ...... | 257/737 |
| 2007/0158199 A1 * | 7/2007 | Haight et al. | ...... | 205/80 |

FOREIGN PATENT DOCUMENTS

JP    10-125818    5/1998

* cited by examiner

Primary Examiner — Luan Van
(74) Attorney, Agent, or Firm — IPUSA, PLLC

(57) ABSTRACT

A manufacturing method of a wiring board includes a sticking layer forming step; a resist film forming step of forming a resist film on an upper surface of the sticking layer, the resist film having an opening exposing the upper surface of the sticking layer; a metal layer forming step of forming a metal layer, so as to cover an upper surface of the resist film and cover a side surface of the resist film and the upper surface of the sticking layer forming the opening for forming the wiring; a plating film forming step of filling with a plating film the opening for forming the wiring; a metal layer and plating film removing step; a resist film removing step; and a sticking layer removing step of removing the sticking layer of an unnecessary part not covered with the metal layer, after the resist film removing step.

3 Claims, 28 Drawing Sheets

MANUFACTURING METHOD OF WIRING BOARD

BACKGROUND OF THE INVENTION

1. Field of the Invention

The present invention generally relates to manufacturing methods of wiring boards. More specifically, the present invention relates to a manufacturing method of a wiring board having a wiring formed on an insulating layer.

2. Description of the Related Art

FIG. 1 is a cross-sectional view of a related art wiring board.

As shown in FIG. 1, a related art wiring board 200 is a built-up board having a core. The wiring board 200 includes a core substrate 201, piercing electrodes 202, pads 203, insulating layers 204 and 212, wiring patterns 206, wirings 207 and 211, solder resist layers 208 and 216, via forming parts 213, and outside connection pads 214.

The core substrate 201 is a plate-shaped substrate and has piercing holes 221. The piercing electrodes 202 are provided in the piercing holes 221. The pads 203 are provided on an upper surface 201A of the core substrate 201 and upper ends of the piercing electrodes 202. Because of this, the pads 203 are electrically connected to the piercing electrodes 202.

The insulating layer 204A is provided on the upper surface 201A of the core substrate 201 so as to cover a part of the pads 203. The insulating layer 204 includes opening parts 223 exposing upper surfaces of the pads 203.

The wiring pattern 206 include the via forming parts 225 provided in the opening parts 223 and the wirings 226 formed in a body with the via forming parts 225. Each of the via forming parts 225 includes a copper (Cu) layer 228 and a Cu plating film 229. The Cu layer 228 is provided in the opening part 223. The Cu plating film 229 fills the opening part 223 where the Cu layer 228 is formed. A lower end of the via forming part 225 is connected to the pad 203.

Each of the wirings 226 is provided on the upper end of the via-forming part 225 and the upper surface 204A. The wiring 226 includes the Cu layer 228 and the Cu plating film 229. The Cu layer 228 is provided on the upper surface 204A of the insulating layer 204. The Cu plating film 229 is provided on the Cu layer 228 and the via-forming part 225. The wirings 226 have electronic component mounting pads 231 where an electronic component is mounted. The wirings 226 are electrically connected to the pads 203 via the via-forming part 225.

Each of the wirings 207 is provided on the upper surface 204A of the insulating layer 204. The wiring 207 includes the Cu layer 228 and the Cu plating film 229. The Cu layer 228 is provided on the upper surface 204A of the insulating layer 204. The Cu plating film 229 is provided on the Cu layer 228. The wiring 207 has a narrow width equal to or less than 10 µm.

The solder resist layer 208 is provided on the upper surface 204A of the insulating layer 204 so as to cover the wirings 207 and the wirings 226 except the electronic component mounting pads 231. The solder resist layer 208 has an opening 208A exposing the upper surface of each of the electronic component mounting pads 231.

Each of the wirings 211 is provided on the lower end of the piercing electrode 202 and the lower surface 201B of the core substrate 201. With this structure, the wiring 211 is electrically connected to the pad 203 via the piercing electrode 202.

The insulating layer 212 is provided on the lower surface 201B of the core substrate 201 so as to cover a part of the wirings 211. The insulating layer 212 has an opening 233 exposing a part of the lower surface of each of the wirings 211.

The via forming parts 213 are provided in the openings 233. Each of the via forming parts 213 includes a Cu layer 235 and a Cu plating film 236. The Cu layer 235 is provided in the opening part 233. The Cu plating film 236 fills the opening part 233 where the Cu layer 235 is formed. An upper end of the via forming part 213 is connected to the wiring 211.

The outside connection pads 214 are provided on the lower surface 212A of the insulating layer 212 and the lower ends of the via forming parts 213. Each of the outside connection pads 214 is formed in a body with the via forming part 213. The outside connection pad 214 includes a Cu layer 235 and a Cu plating film 236. The Cu layer 235 is provided on the lower surface 212A of the insulating layer 212. The Cu plating film 236 is provided on the lower surface of the Cu layer 235 and the lower end of the via forming part 235. The outside connection pads 214 connect the wiring board 200 to a mounting board (not illustrated in FIG. 1) such as a mother board. The solder resist layer 216 is provided on the lower surface 212A of the insulating layer 212 so as to cover parts of the outside connection pads 214. The solder resist layer 216 has openings 216A exposing the lower surfaces of the outside connection pads 214.

FIG. 2 through FIG. 8 are views showing a manufacturing method of the related art wiring board. In FIG. 2 through FIG. 8, parts that are the same as the parts shown in FIG. 1 are given the same reference numerals, and explanation thereof is omitted.

The manufacturing method of the related art wiring board 200 is discussed with reference to FIG. 2 through FIG. 8. First, in a step shown in FIG. 2, the piercing holes 221, the piercing electrodes 202, the pads 203, the insulating layer 204 having the openings 223 the wirings 211, and the insulating layer 212 having the openings 233 are formed in the core substrate 201 by a known method. After that, a roughening process such as a desmear process is applied to the insulating layers 204 and 212 so that the upper surface 204A of the insulating layer 204, a surface of each of the pads 203 exposed by the opening 223, the lower surface 212A of the insulating layer 212, and a surface of each of the wirings 211 exposed by the opening 233 is roughened.

Next, in a step shown in FIG. 3, by an electroless plating method, the Cu layer 228 covering the upper surface of a structural body shown in FIG. 2 and a Cu layer 235 covering the lower surface of the structural body shown in FIG. 2 are formed.

Next, in a step shown in FIG. 4, the resist film 241 having openings 241A and 241B for forming wirings are formed on the upper surface of the Cu layer 228 and the resist film 242 having an openings 242A is formed on the lower surface of the Cu layer 235. At this time, the openings 241A for forming the wirings are formed so that an upper surface of the Cu layer 228 corresponding to parts where the wirings 226 are to be formed is exposed. The openings 241B for forming the wirings are formed so that an upper surface of the Cu layer 228 corresponding to parts where the wirings 207 are to be formed is exposed. Furthermore, the openings 242A are formed so that a lower surface of the Cu layer 235 corresponding to parts where the outside connection pads 214 are to be formed is exposed.

Next, in a step shown in FIG. 5, by an electrolytic plating method where the Cu layer 228 is used as a feeding layer, the Cu plating film 229 filling the openings 223 and 233 and the openings 241A and 241B is formed. In addition, by an electrolytic plating method where the Cu layer 235 is used as a feeding layer, the Cu plating film 236 filling the openings 242A is formed. As a result of this, the via forming parts 213 and 225 are formed.

After that, in a step shown in FIG. 6, the resist films 241 and 242 shown in FIG. 5 are removed.

Then in a step shown in FIG. 7, by a wet etching method, an unnecessary part of the Cu layer 228 which is not covered with the Cu plating film 229 and an unnecessary part of the Cu layer 235 which is not covered with the Cu plating film 236 are removed. As a result of this, the wirings 226 and 207 and the outside connection pads 214 are formed. In other words, the wirings 226 and 207 and the outside connection pads 214 are formed by a semi-additive method.

Next, in a step shown in FIG. 8, the solder resist layer 208 having the openings 208A is formed on the upper surface 204A of the insulating layer 204; and the solder resist layer 216 having the openings 216A is formed on the lower surface 212A of the insulating layer 212. As a result of this, the related art wiring board 200 is manufactured. See, for example, Japanese Laid-Open Patent Application Publication No. 10-125818.

FIG. 9 is a view showing problems of the manufacturing method of the related art wiring board.

In FIG. 9, "$W_1$" represents a designated width of the wiring 207 in design; and "$W_2$" represents a designated width of the wiring 226 in design.

However, according to the manufacturing method of the related art wiring board 200, in the step shown in FIG. 7, when the unnecessary parts of the Cu layers 228 and 235 are removed, the parts of the Cu layer 228 and the Cu plating film 229 forming the wirings 207 and 226 are also etched as shown in FIG. 9. Accordingly, the widths of the wirings 207 and 226 become less than the designated widths $W_1$ and $W_2$. Especially when the wirings 207 having a narrow wiring width equal to or less than 10 µm exist, this problem is more serious. The same problem may exist when the outside connection pads 214 are formed by the semi-additive method.

SUMMARY OF THE INVENTION

Accordingly, embodiments of the present invention may provide a novel and useful manufacturing method of a wiring board solving one or more of the problems discussed above.

More specifically, the embodiments of the present invention may provide a manufacturing method of a wiring board whereby a wiring having a designated width (width in design) can be formed.

One aspect of the embodiments of the present invention may be to provide a manufacturing method of a wiring board, the wiring board including an insulating layer and a wiring formed on an upper surface of the insulating layer, the manufacturing method including a sticking layer forming step of forming a sticking layer covering the upper surface of the insulating layer; a resist film forming step of forming a resist film on an upper surface of the sticking layer, the resist film having an opening for forming the wiring, the opening exposing the upper surface of the sticking layer of a part corresponding to an area where the wiring is to be formed; a metal layer forming step of forming a metal layer, the metal layer being more difficult to etch than the sticking layer, so as to cover an upper surface of the resist film and cover a side surface of the resist film and the upper surface of the sticking layer forming the opening for forming the wiring; a plating film forming step of filling with a plating film the opening for forming the wiring, by an electrolytic plating method where the metal layer is a feeding layer; a metal layer and plating film removing step of removing the plating film and the metal layer formed above the upper surface of the resist film; a resist film removing step of removing the resist film after the metal layer and plating film removing step; and a sticking layer removing step of removing the sticking layer of an unnecessary part not covered with the metal layer, after the resist film removing step.

Another aspect of the embodiments of the present invention may be to provide a manufacturing method of a wiring board, the wiring board including an insulating layer and a wiring formed on an upper surface of the insulating layer, the manufacturing method including a resist film forming step of forming a resist film on an upper surface of the insulating layer, the resist film having an opening for forming the wiring, the opening exposing the upper surface of the insulating layer of a part corresponding to an area where the wiring is to be formed; a metal layer forming step of forming a metal layer so as to cover an upper surface of the resist film, a side surface of the resist film forming the opening for forming the wiring and the upper surface of the insulating layer; a plating film forming step of filling with a plating film the opening for forming the wiring, by an electrolytic plating method where the metal layer is a feeding layer; a wiring forming step of removing the plating film and the metal layer formed above the upper surface of the resist film so that the wiring is formed; and a resist film removing step of removing the resist film after the wiring forming step.

Additional objects and advantages of the embodiments will be set forth in part in the description which follows, and in part will be obvious from the description, or may be learned by practice of the invention. The object and advantages of the embodiments will be realized and attained by means of the elements and combinations particularly pointed out in the appended claims.

It is to be understood that both the foregoing general description and the following detailed description are exemplary and explanatory only and are not restrictive of the invention as claimed.

DETAILED DESCRIPTION OF THE PREFERRED EMBODIMENTS

A description is given below, with reference to FIG. 10 through FIG. 28 of embodiments of the present invention.

First Embodiment

Figure 1:
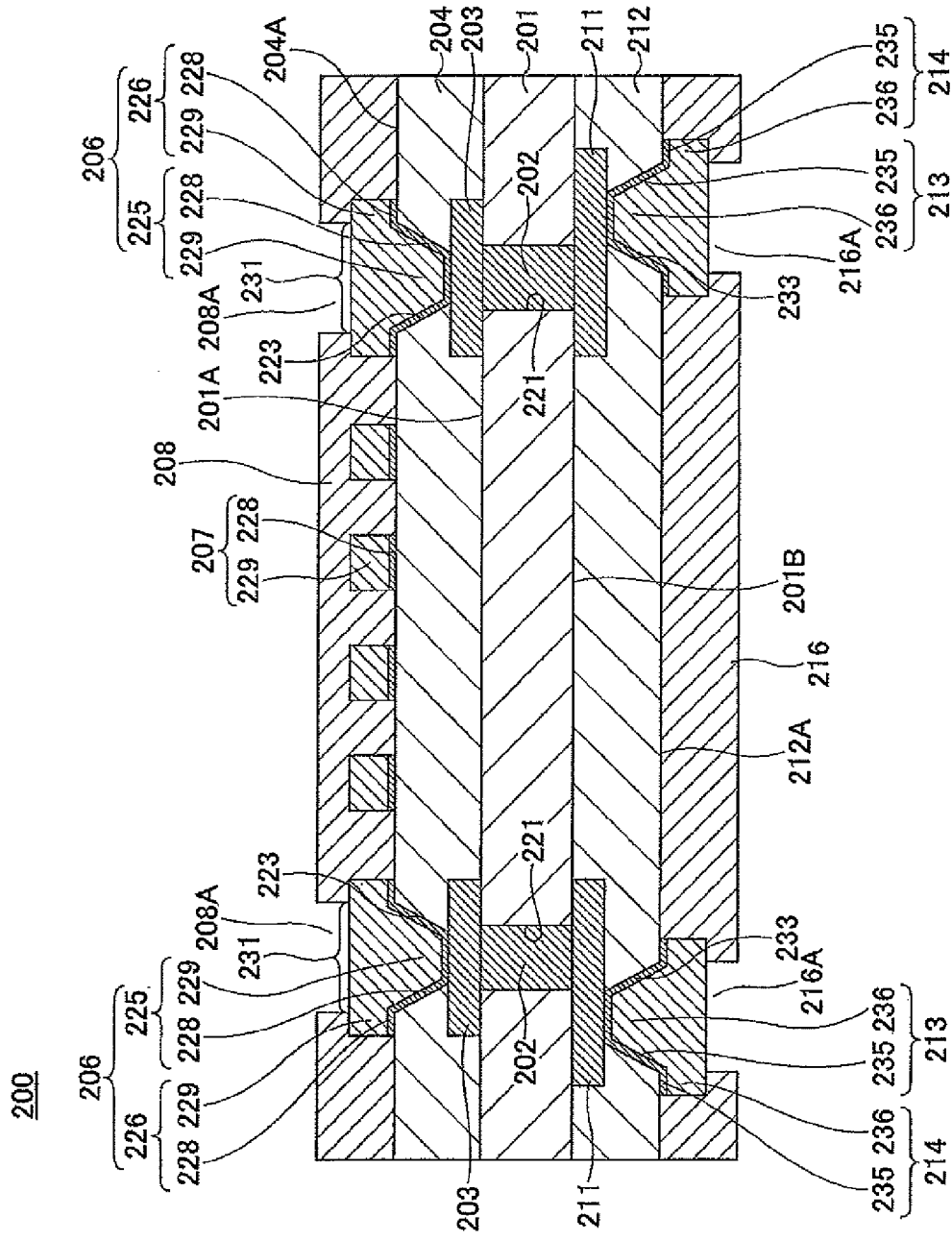
FIG. 1 is a cross-sectional view of a related art wiring board.
Figure 2:
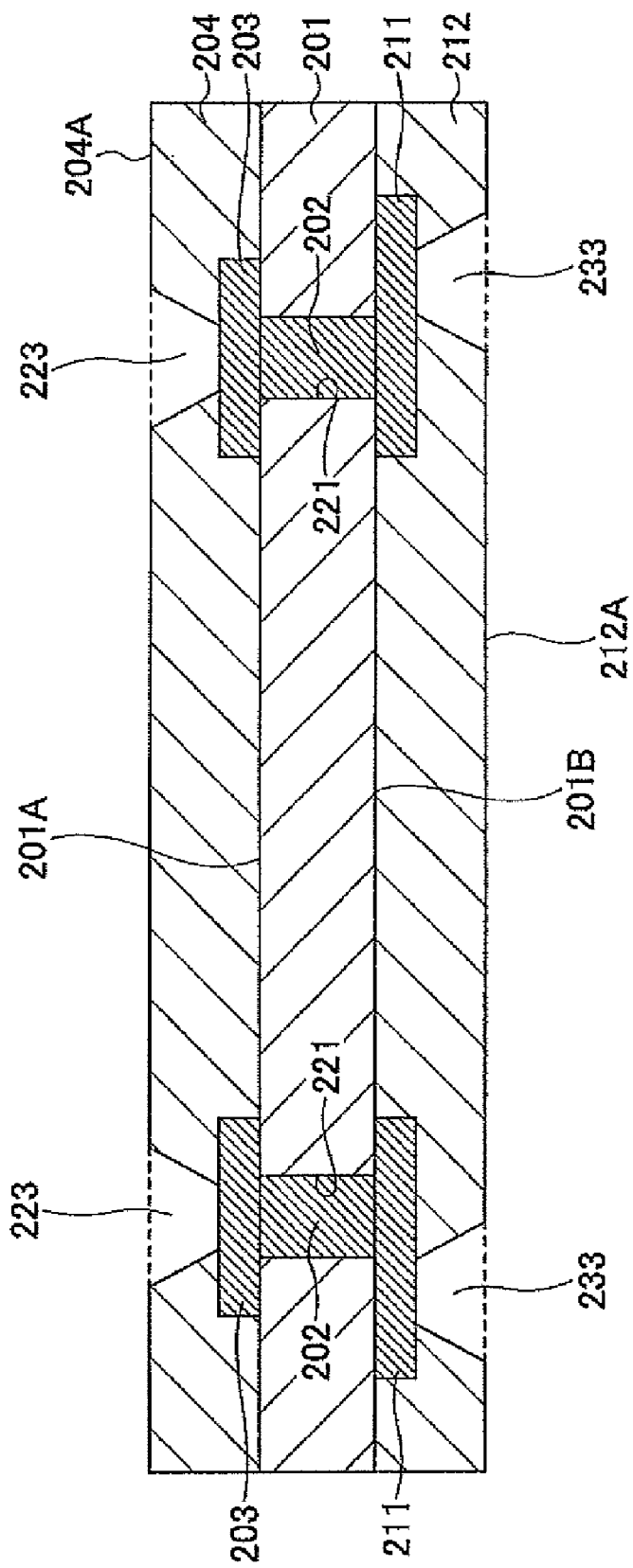
FIG. 2 is a first view showing a manufacturing method of the related art wiring board.
Figure 3:
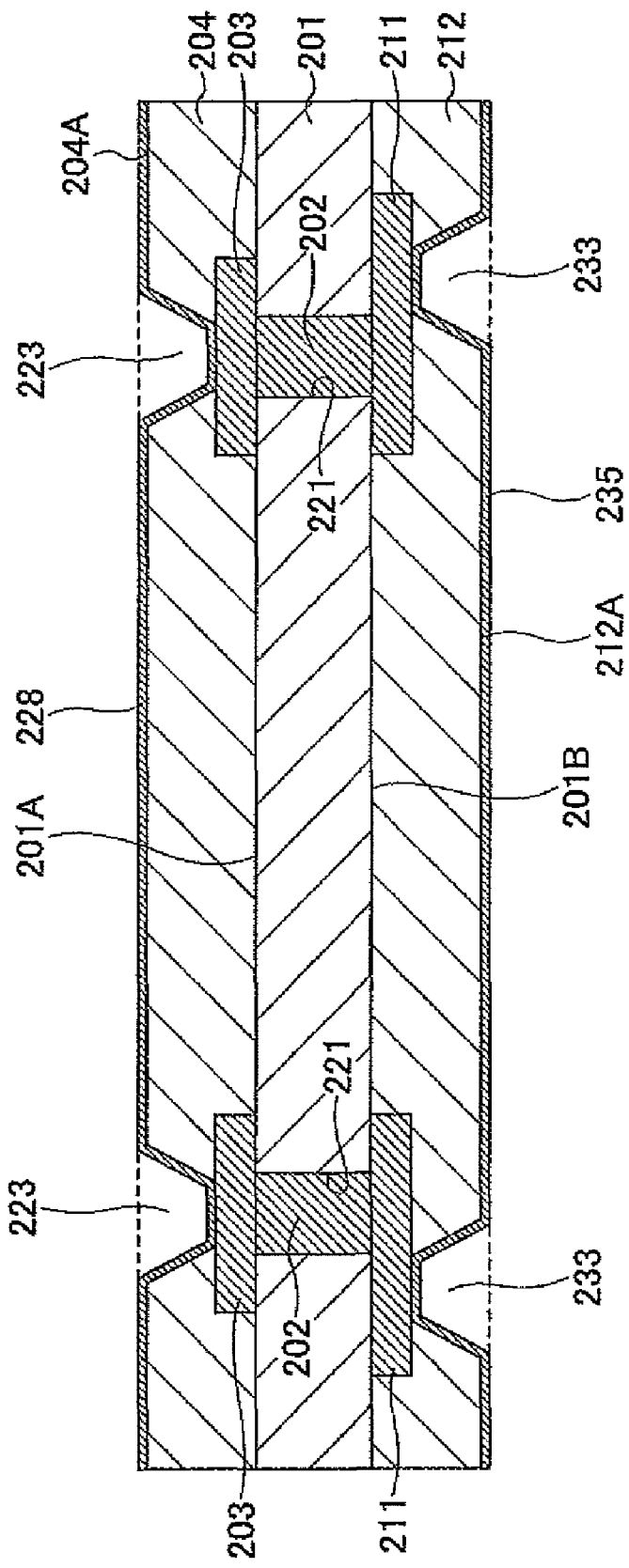
FIG. 3 is a second view showing the manufacturing method of the related art wiring board.
Figure 4:
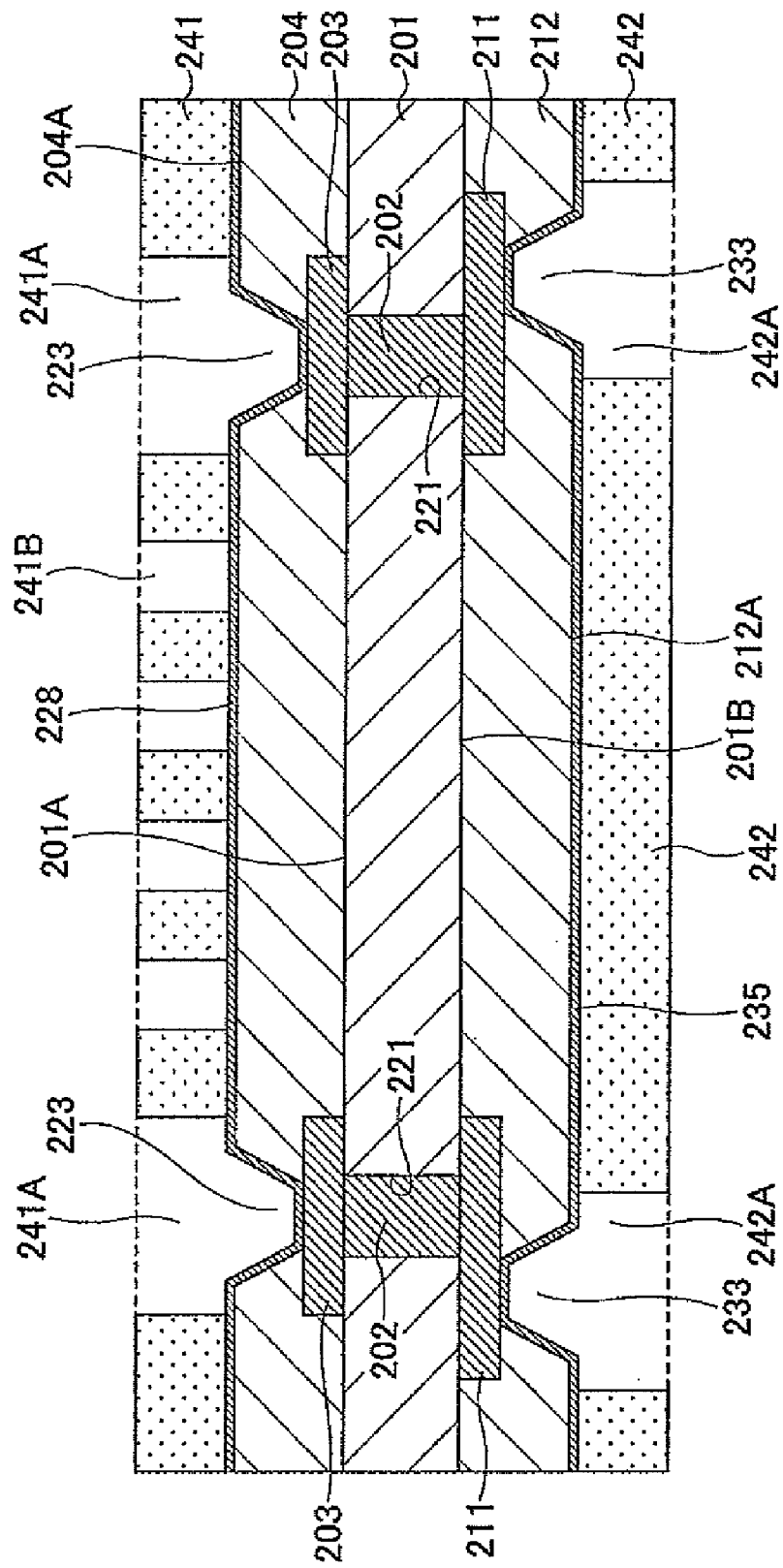
FIG. 4 is a third view showing a manufacturing method of the related art wiring board.
Figure 5:
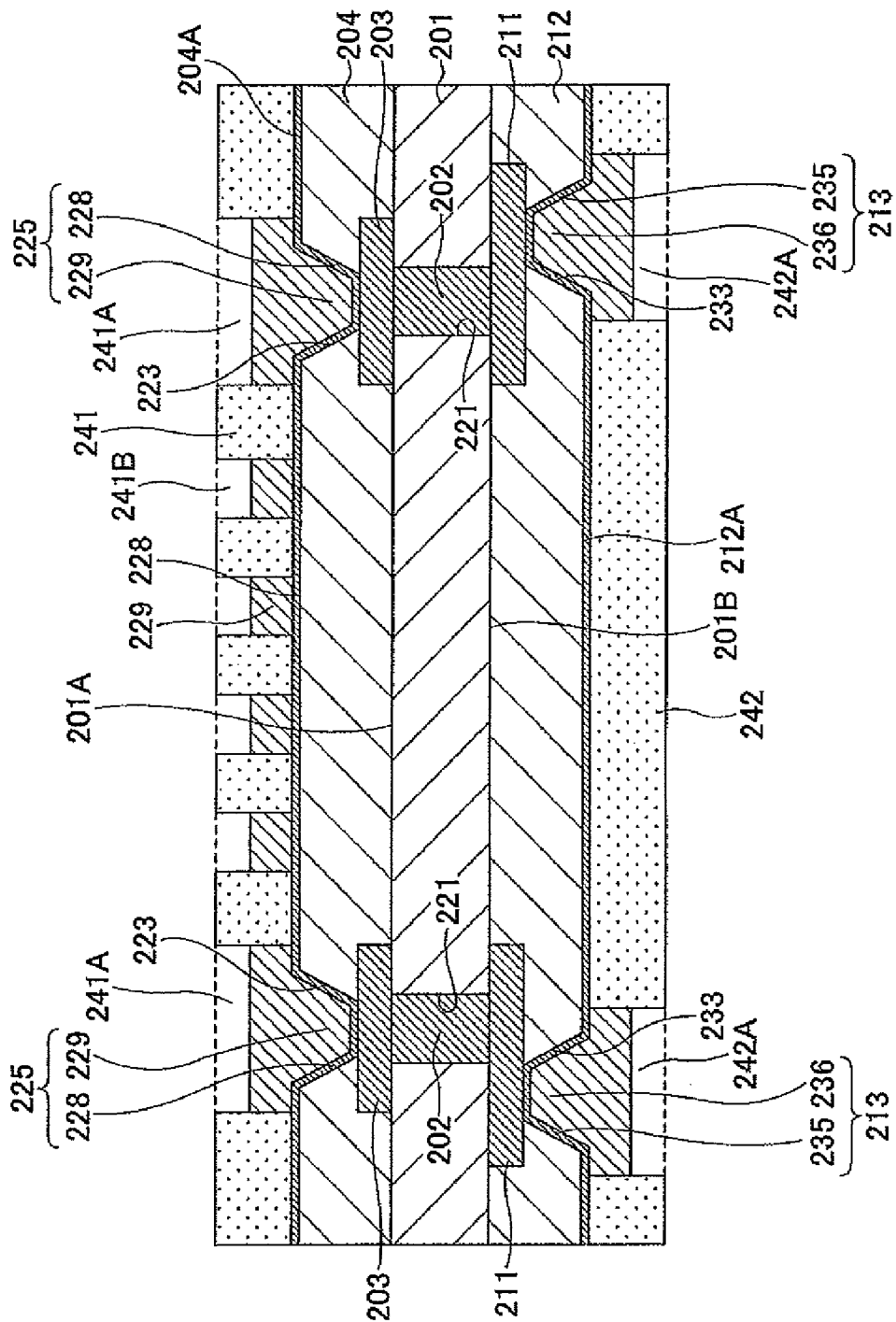
FIG. 5 is a fourth view showing the manufacturing method of the related art wiring board.
Figure 6:
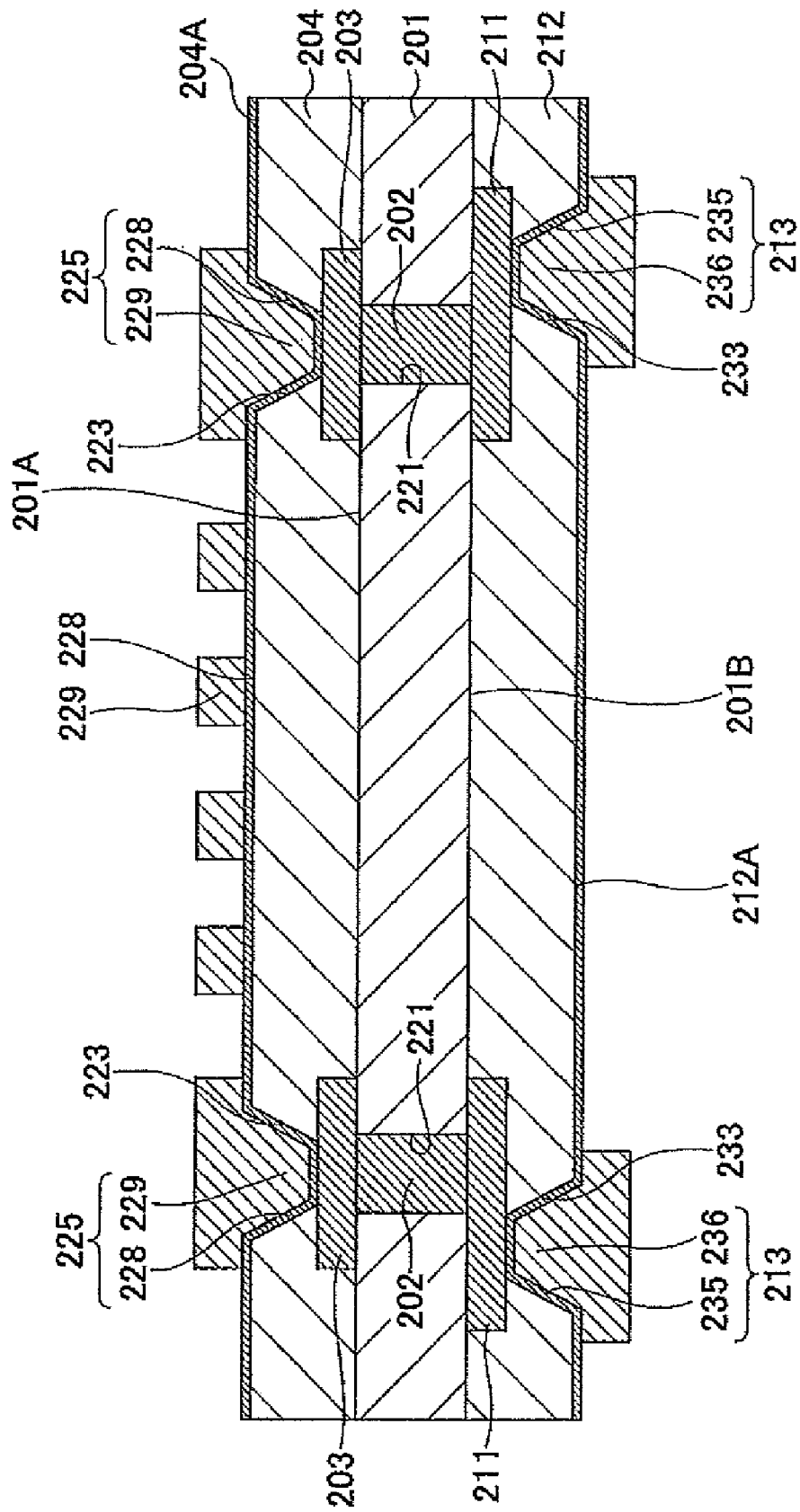
FIG. 6 is a fifth view showing a manufacturing method of the related art wiring board.
Figure 7:
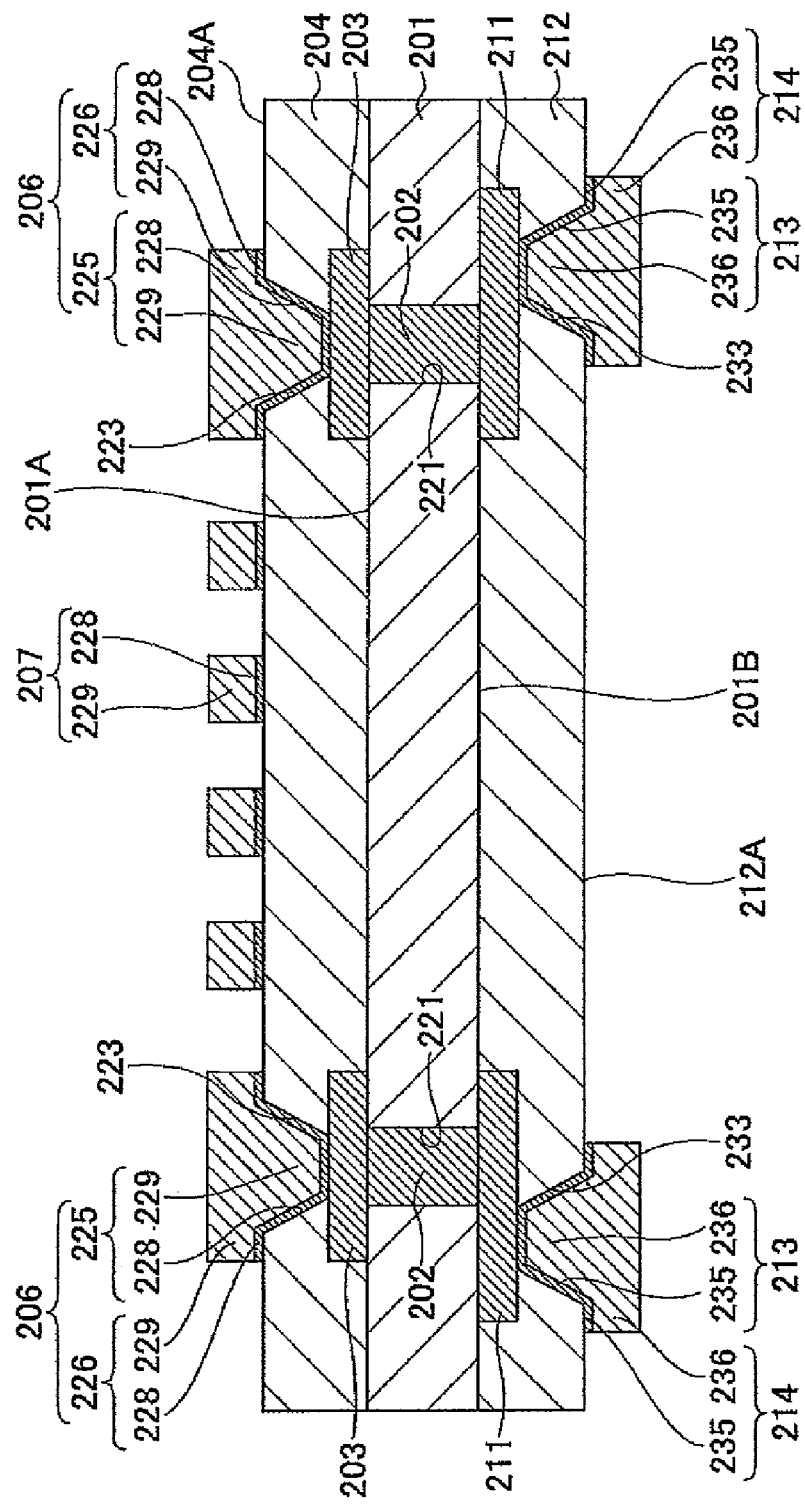
FIG. 7 is a sixth view showing the manufacturing method of the related art wiring board.
Figure 8:
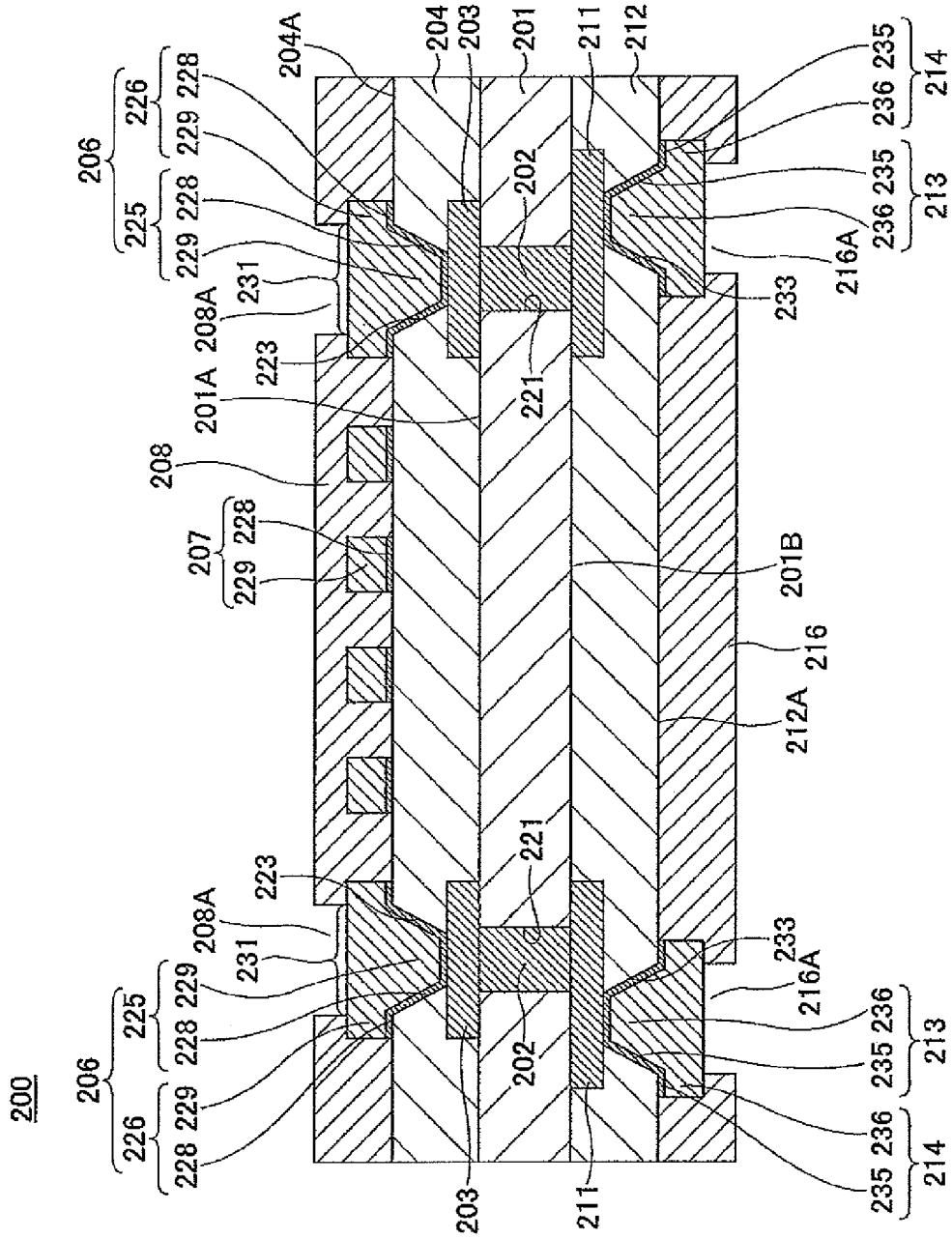
FIG. 8 is a seventh view showing the manufacturing method of the related art wiring board.
Figure 9:
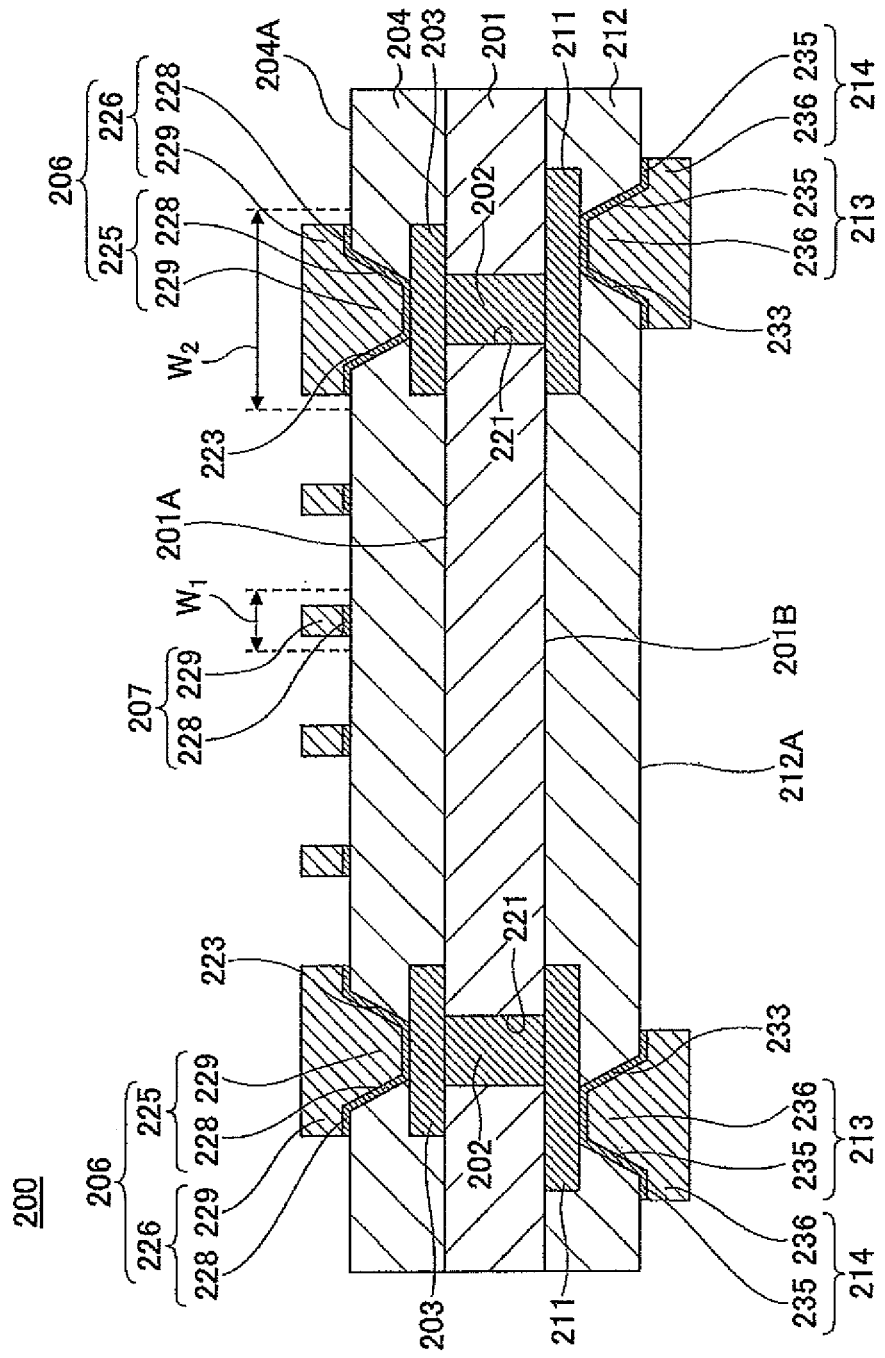
FIG. 9 is a view showing problems of the manufacturing method of the related art wiring board.
Figure 10:
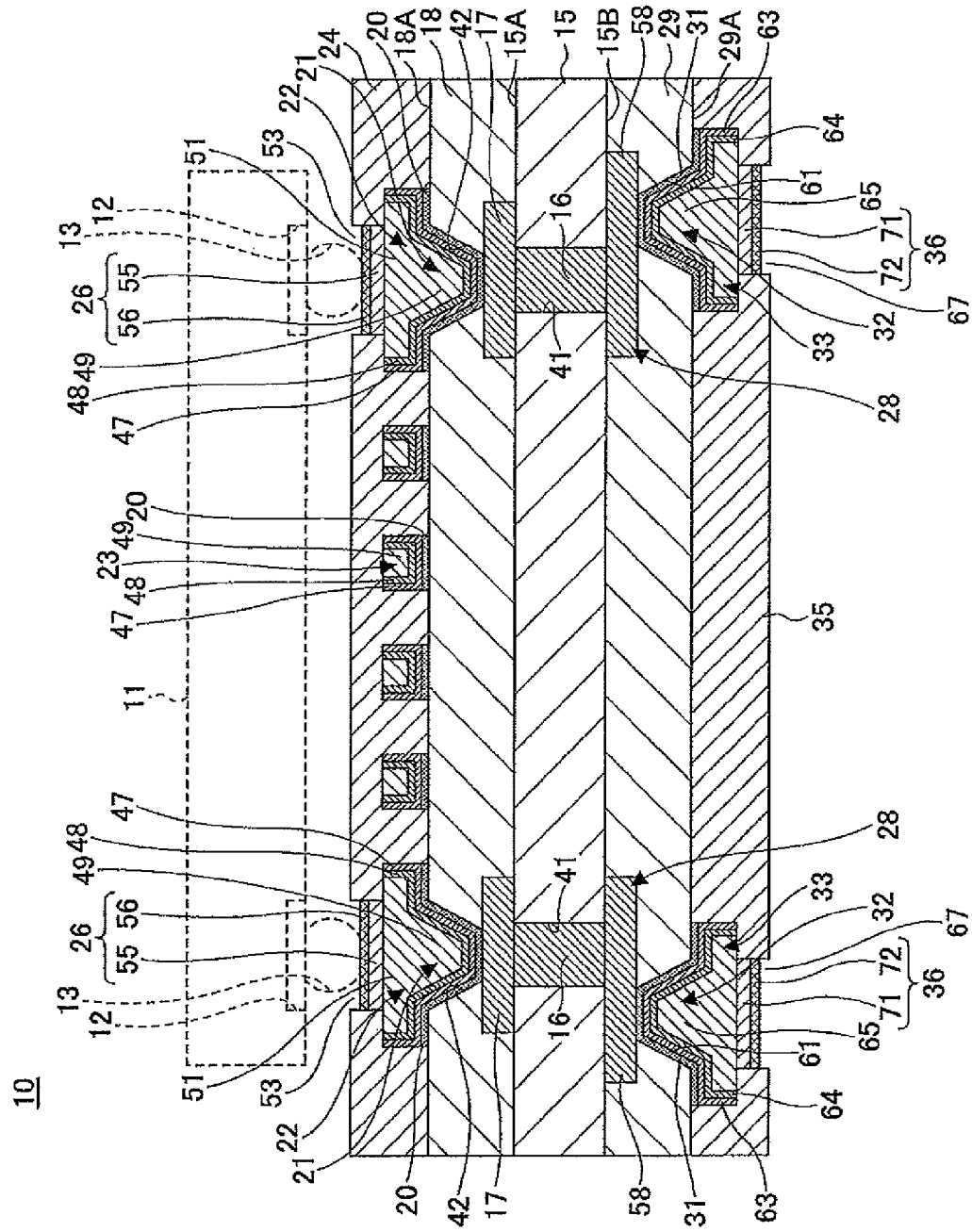
FIG. 10 is a cross-sectional view of a wiring board of a first embodiment of the present invention.
Figure 11:
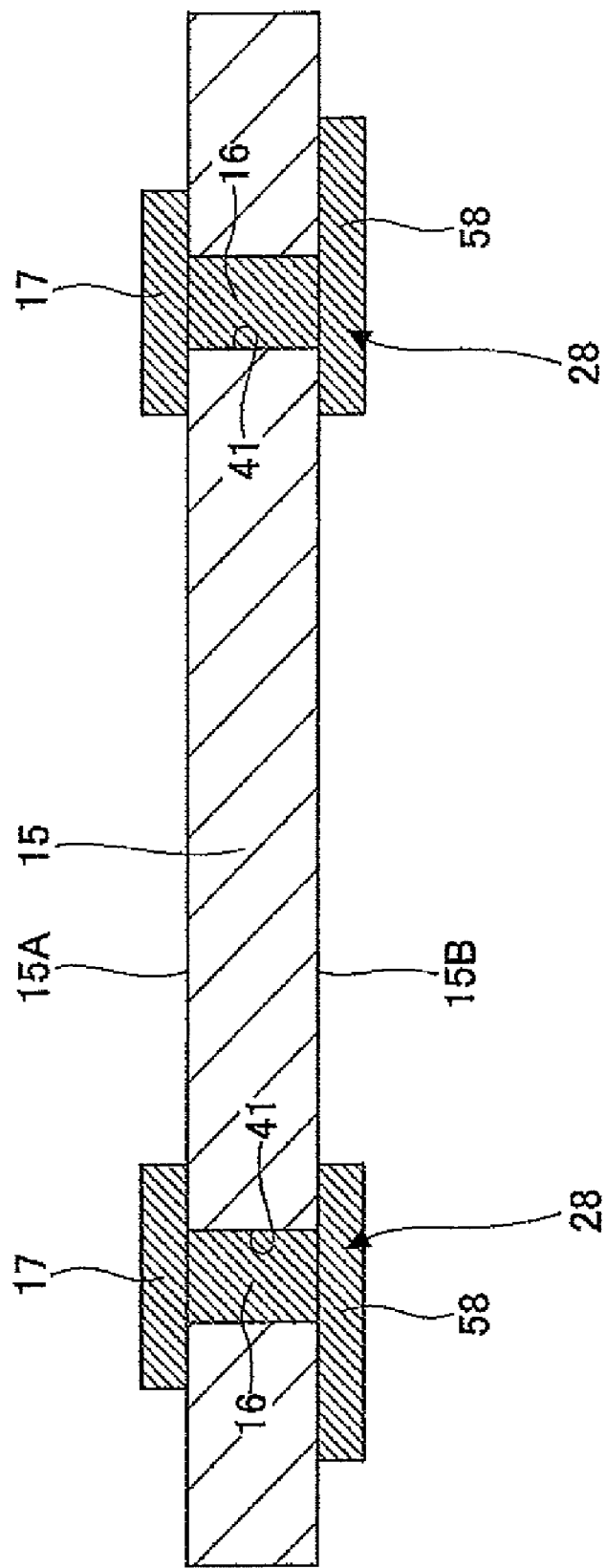
FIG. 11 is a first view showing a manufacturing method of the wiring board of the first embodiment of the present invention.

FIG. 10 is a cross-sectional view of a wiring board of a first embodiment of the present invention.

As shown in FIG. 10, a wiring board 10 of the first embodiment of the present invention is a built-up board having a core. The wiring board 10 includes a core substrate 15, piercing electrodes 16, pads 17, insulating layers 18 and 29, sticking layers 20 and 31, via forming parts 21 and 32, wirings 22 and 23, wiring patterns 28, solder resist layers 24 and 35, diffusion prevention films 26 and 36 and outside connection pads 33.

The core substrate 15 is a plate-shaped substrate and has piercing holes 41. For example, a glass epoxy substrate can be used as the core substrate 15.

The piercing electrodes 16 are provided in the piercing holes 41. For each of the piercing electrodes 16 an upper end is connected to the pad 17 and a lower end of the piercing electrode 16 is connected to the wiring pattern 28. The piercing electrode 16 is configured to electrically connect the pad 17 and the wiring pattern 28 to each other. Cu, for example, can be used as a material of the piercing electrode 16.

The pads 17 are provided on an upper surface 15A of the core substrate 15 and the upper ends of the piercing electrodes 16. Cu, for example, can be used as a material of the pads 17.

The insulating layer 18 is provided on the upper surface 15A of the core substrate 15 so as to cover parts of the pads 17. The insulating layer 18 includes opening parts 42 exposing upper surfaces of the pads 17. An insulating resin layer can be used as the insulating layer 18. In addition, for example, epoxy resin, polyimide resin, or the like can be used as a material of the insulating resin layer.

The sticking layer 20 is provided on upper surfaces of the pads 17 and a surface of the insulating layer 18 which form the opening part 42 and the upper surface 18A of the insulating layer 18 corresponding to an area where the wirings 22 and 23 are formed. The sticking layer 20 is configured to improve sticking abilities between the via forming parts 21 and the wirings 22 and 23 and the insulating layer 18. For example, a NiCu alloy layer, a metal layer made of Ni, Ti, Ta, W, or V, an alloy layer including Ni, Ti, Ta, W, or V, or the like can be used as the sticking layer 20. In the case where the NiCu alloy layer is used as the sticking layer 20, the thickness of the sticking layer 20 may be, for example, approximately 30 nm through approximately 100 nm. In addition, in the case where a NiCu alloy layer is used as the sticking layer 20, the content of Ni in the NiCu alloy can be, for example, approximately 25 wt % through approximately 33 wt %.

The via forming parts 21 are provided in the opening parts 42 where the sticking layer 20 is formed. Each of the via forming part 21 includes a protection metal layer 47, a seed layer 48, and a plating film 49. The protection metal layer 47 is configured to cover the sticking layer 20 formed in the opening part 42. The seed layer 48 is configured to cover the protection metal layer 47. The plating film 49 is configured to fill the opening part 42 where the protection metal layer 47 and the seed layer 48 are formed. Details of the protection metal layer 47 are discussed when details of the wirings 22 are discussed. The seed layer 48 is a feeding layer when the plating film 49 is formed by an electrolytic plating method. A Cu layer, for example, can be used as the seed layer 48. In the case where the Cu layer is used as the seed layer 48, the thickness of the seed layer 48 may be, for example, approximately 300 nm through approximately 500 nm. A Cu plating film, for example, can be used as the plating film 49.

The wirings 22 are provided on the upper surface 18A of the insulating layer 18. Each of the wirings 22 is formed in a body with an upper end of the via forming part 21. The wiring 22 includes the plating film 49, the seed layer 48, and the protection metal layer 47. The seed layer 48 is formed on a side wall and a lower surface of the plating film 49. The protection metal layer 47 is configured to cover the seed layer 48. Etching of the protection metal layer 48 may be more difficult than that of the sticking layer 20.

Thus, the protection metal layer 47 which may not be etched easier than the sticking layer 20 is provided so as to cover the seed layer 48 provided on the side wall of the plating film 49 forming the wiring 22. Accordingly, in a step shown in FIG. 19 (sticking layer removing step) discussed below, when an unnecessary part of the sticking layer 20 is removed by etching, the protection metal layer 47 works as an etching stopper layer. Hence, it is possible to prevent the seed layer 48 provided on the side wall part of the wiring 22 and the plating film 49 from being etched. Accordingly, it is possible to set the width of the wiring 22 formed after the sticking layer removing step to a designated wiring width (width in design).

For example, a NiCu alloy layer, a metal layer made of Ni, Ti, Ta, W, or V, an alloy layer including Ni, Ti, Ta, W, or V, or the like can be used as the protection metal layer 47. In the case where the NiCu alloy layer is used as the sticking layer 20 and the protection metal layer 47, the content of Ni in the NiCu alloy forming the protection metal layer 47 may be greater than the content of Ni in the NiCu alloy forming the sticking layer 20.

Thus, by setting the content of Ni in the NiCu alloy forming the protection metal layer 47 to be greater than the content of Ni in the NiCu alloy forming the sticking layer 20, it is possible to make the etching rate of the protection metal layer 47 less than that of the sticking layer 20.

In addition, the thickness of the protection metal layer 47 may be greater than that of the sticking layer 20. For example, the thickness of the protection metal layer 47 may be twice or more than that of the sticking layer 20.

Thus, by setting the thickness of the protection metal layer 47 to be greater than that of the sticking layer 20, after the sticking layer removing step, it is possible to securely retain the protection metal layer 47 formed on the side wall of the plating film 49 forming the wiring 22 via the seed layer 48. In a case where the NiCu alloy layer having the thickness of approximately 30 nm through approximately 100 nm is the sticking layer 20, the thickness of the protection metal layer 47 may be, for example, approximately 300 nm through approximately 500 nm.

Each of the wirings 22 having the above-discussed structure has a pad 51 where the diffusion prevention film 26b is formed. The pad 51 is electrically connected to the electrode pad 12 of the semiconductor element 11 via the diffusion prevention film 26.

The wirings 23 are provided on the sticking layer 20 formed on the upper surface 18A of the insulating layer 18. Each of the wirings 23 includes the plating film 49, the seed layer 48, and the protection metal layer 47. The seed layer 48 is formed on a side wall and the lower surface of the plating film 49. The protection metal layer 47 formed on the sticking layer 20 is configured to cover the seed layer 48. Etching of the protection metal layer 47 may be more difficult than that of the sticking layer 20.

Thus, the protection metal layer 47 which may not be etched easier than the sticking layer 20 is provided so as to cover the seed layer 48 provided on the side wall of the plating film 49 forming the wiring 23. Accordingly, in the step shown in FIG. 19 (sticking layer removing step) discussed below, when the unnecessary part of the sticking layer 20 is removed by etching, the protection metal layer 47 works as an etching stopper layer. Hence, it is possible to prevent the seed layer 48 provided on the side wall part of the wiring 23 and the plating film 49 from being etched. Accordingly, it is possible to set the width of the wiring 23 formed after the sticking layer removing step to a designated wiring width (width in design). The above-discussed protection metal layer 47 is effective especially in a case where the widths of the wirings 22 and 23 in design are narrow, for example equal to or less than 10 μm.

The solder resist layer 24 is provided on the upper surface 18A of the insulating layer 18 so as to cover the wirings 22 and the wirings 23 except the pads 51. The solder resist layer 24 has openings 53 exposing the upper surfaces of the pad 51.

The diffusion prevention film 26 is provided on the upper surface of each of the pad 51 exposed by the opening 53. The diffusion prevention film 26 is electrically connected to the electrode pad 12 of the semiconductor element 11 via the bump 13. The diffusion prevention film 26 includes the Ni layer 55 and the Au layer 56. The Ni layer 55 is formed on the upper surface of the pad 51 and has thickness of, for example, approximately 3 μm through approximately 5 μm. The Au layer 56 is stacked on the Ni layer 55 and has thickness of, for example, approximately 0.1 μm.

The wiring patterns 28 are provided on the lower surface 15B of the core substrate 15 and the lower end of the piercing electrodes 16. Each of the wiring patterns 28 is electrically connected to the piercing electrode 16. The wiring pattern 28 includes a pad 5B. The pad 58 is electrically connected to the wiring pattern 32 via the sticking layer 31. For example, Cu can be used as the material of the wiring pattern 28.

The insulating layer 29 is provided on the lower surface 15B of the core substrate 15 so as to cover the wiring patterns 28 except the pads 58. The insulating layer 29 includes opening parts 61 exposing a part of the lower surface of each of the pads 58. An insulating resin layer can be used as the insulating layer 29. In addition, for example, epoxy resin, polyimide resin, or the like can be used as a material of the insulating resin layer.

The sticking layer 31 is provided on a lower surface of each of the pads 58 forming the opening part 61, a surface of the insulating layer 29, and the lower surface 29A of the insulating layer 29 corresponding to an area where the outside connection pads 33 are formed. The sticking layer 31 is configured to improve sticking abilities between the via forming parts 32 and the outside connection pads 33 and the insulating layer 29. For example, a NiCu alloy layer, a metal layer made of Ni, Ti, Ta, W, or V, an alloy layer including Ni, Ti, Ta, W, or V, or the like can be used as the sticking layer 31. In the case where the NiCu alloy layer is used as the sticking layer 31, the thickness of the sticking layer 31 may be, for example, approximately 30 nm through approximately 100 nm. In addition, in the case where NiCu alloy layer is used as the sticking layer 31, the content of Ni in the NiCu alloy can be, for example, approximately 25 wt % through approximately 33 wt %.

The via forming parts 32 are provided in the opening parts 61 where the sticking layer 31 is formed. Each of the via forming parts 32 includes a protection metal layer 63, a seed layer 64, and a plating film 65. The protection metal layer 63 is configured to cover the sticking layer 31 formed in the opening part 61. The seed layer 64 is configured to cover the protection metal layer 63. The plating film 65 is configured to fill the opening part 61 where the protection metal layer 63 and the seed layer 64 are formed. The protection metal layer 63 forming the via forming part 32 is provided so as to cover the sticking layer 31 formed in the opening part 61. Details of the protection metal layer 63 are discussed when the outside connection pad 33 is discussed below. The seed layer 64 is a feeding layer when the plating film 65 is formed by an electrolytic plating method. A Cu layer, for example, can be used as the seed layer 64. In the case where the Cu layer is used as the seed layer 64, the thickness of the seed layer 64 may be, for example, approximately 300 nm through approximately 500 nm. A Cu plating film, for example, can be used as the plating film 65.

The outside connection pads 33 are provided on the lower surface 29A of the insulating layer 29. Each of the outside connection pads 33 is formed in a body with an lower end of the via forming part 32. The outside connection pad 33 includes the plating film 65, the seed layer 64, and the protection metal layer 63. The seed layer 64 is formed on a side wall and a lower surface of the plating film 65. The protection metal film 63 is configured to cover the seed layer 64. Etching of the protection metal layer 63 may be more difficult than that of the sticking layer 31.

Thus, the protection metal film 63 which may not be etched easier than the sticking layer 31 is provided so as to cover the seed layer 64 provided on the side wall of the plating film 65 forming the outside connection pad 33. Accordingly, in a step shown in FIG. 19 (sticking layer removing step) discussed below, when an unnecessary part of the sticking layer 31 is removed by etching, the protection metal layer 63 works as an etching stopper layer. Hence, it is possible to prevent the seed layer 64 provided on the side wall part of the outside connection pad 33 and the plating film 65 from being etched. Accordingly, it is possible to set the width of the outside connection pad 33 formed after the sticking layer removing step to a designated wiring width (width in design).

For example, a NiCu alloy layer, a metal layer made of Ni, Ti, Ta, W, or V, an alloy layer including Ni, Ti, Ta, W, or V, or the like can be used as the protection metal layer 63. In the case where the NiCu alloy layer is used as the sticking layer 31 and the protection metal layer 63, the content of Ni in the NiCu alloy forming the protection metal layer 63 may be greater than the content of Ni in the NiCu alloy forming the sticking layer 31.

Thus, by setting the content of Ni in the NiCu alloy forming the protection metal layer 63 to be greater than the content of Ni in the NiCu alloy forming the sticking layer 31, it is possible to make etching rate of the protection metal layer 63 less than that of the sticking layer 31.

In addition, the thickness of the protection metal layer 63 may be greater than that of the sticking layer 31. For example, the thickness of the protection metal layer 63 may be twice or more than that of the sticking layer 31.

Thus, by setting the thickness of the protection metal layer 63 to be greater than that of the sticking layer 31, after the sticking layer removing step, it is possible to securely retain the protection metal layer 63 formed on the side wall of the plating film 65 forming the outside connection pad 33 via the seed layer 64. In a case where the NiCu alloy layer having the thickness of approximately 30 nm through approximately 100 nm as the sticking layer 31, the thickness of the protection metal layer 63 may be, for example, approximately 300 nm through approximately 500 nm.

The solder resist layer 35 is provided on the lower surface 29A of the insulating layer 29 so as to cover the external circumferential part of the outside connection pads 33. The solder resist layer 35 has an opening 67 exposing the lower surface of each of the outside connection pads 33.

The diffusion prevention film 36 is provided on the lower surface of each of the outside connection pads 33 exposed by the opening 67. The diffusion prevention film 36 includes the Ni layer 71 and the Au layer 72. The Ni layer 71 is formed on the lower surface of the outside connection pad 33 and has thickness of, for example, approximately 3 μm through approximately 5 μm. The Au layer 72 is stacked on the Ni layer 71 and has thickness of, for example, approximately 0.1 μm.

According to the semiconductor device of the first embodiment of the present invention, the protection metal layer 47 which may not be etched easier than the sticking layer 20 is provided so as to cover the seed layer 48 provided on the side wall of the plating film 49 forming the wirings 22 and 23. Accordingly, in a step shown in FIG. 19 (sticking layer removing step) discussed below, when an unnecessary part of the sticking layer 20 is removed by etching, the protection metal layer 47 works as an etching stopper layer. Hence, it is possible to prevent the seed layer 48 provided on the side wall part of the wirings 22 and 23 and the plating film 49 from being etched. Accordingly, it is possible to set the width of the wirings 22 and 23 formed after the sticking layer removing step to a designated wiring width (width in design).

FIG. 11 through FIG. 21 are first through eleventh views showing a manufacturing method of the wiring board of the first embodiment of the present invention. In FIG. 11 through FIG. 21, parts that are the same as the parts shown in FIG. 10 are given the same reference numerals, and explanation thereof is omitted.

Next, with reference to FIG. 11 through FIG. 21, a manufacturing method of the wiring board 10 of the first embodiment of the present invention is discussed. First, in the step shown in FIG. 11, the piercing holes 41 and the piercing electrodes 16 are formed by a known method, and then the pads 17 and the wiring patterns 28 are formed (a pad forming step).

Figure 12:
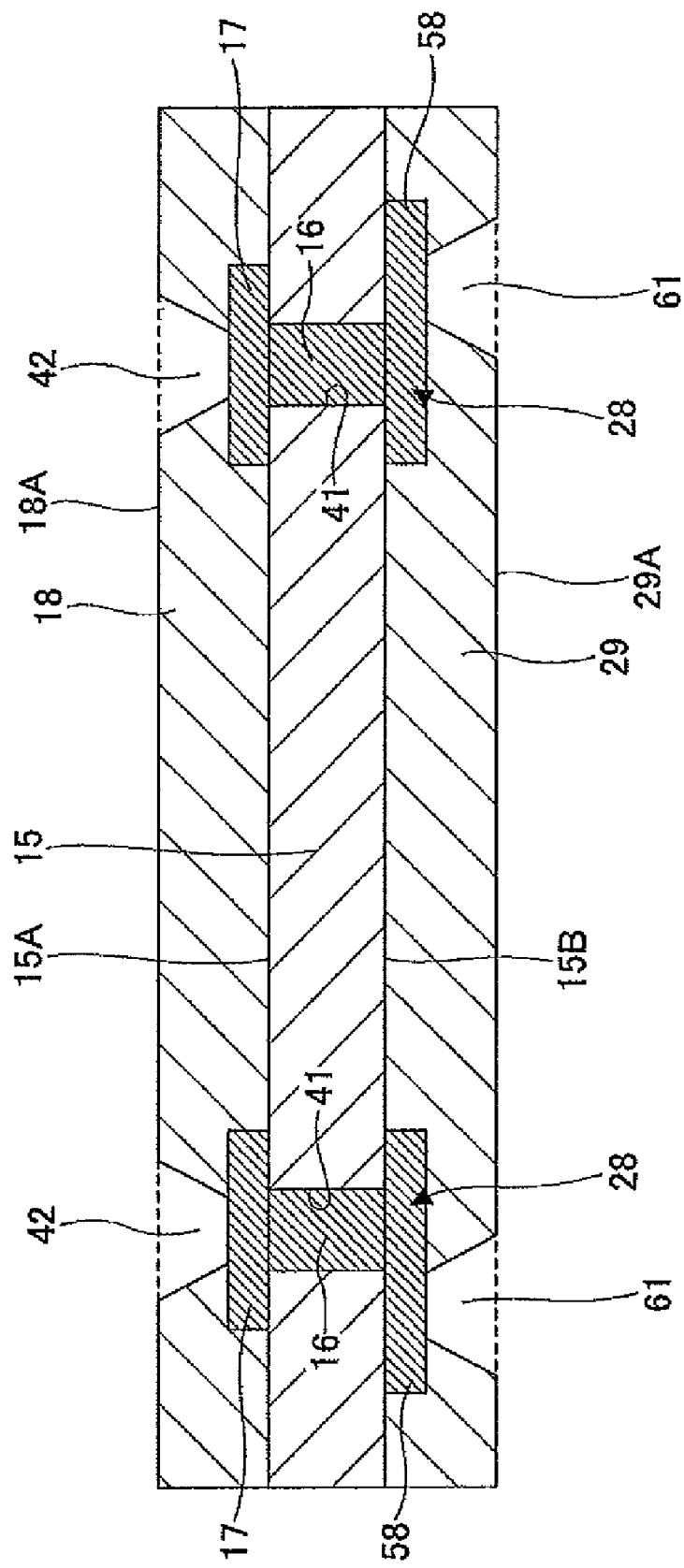
FIG. 12 is a second view showing the manufacturing method of the wiring board of the first embodiment of the present invention.

Next, in a step shown in FIG. 12, the insulating film 18 having the opening parts 42 is formed on the upper surface 15A of the core substrate 15 and the insulating layer 29 having the opening parts 61 is formed on the lower surface 15B of the core substrate 15. After that, a roughening process such as a desmear process is applied so that the upper surface 18A of the insulating layer 18, a surface of the insulating layer 18 exposed by each of the openings 42, the lower surface 29A of the insulating layer 29, and a surface of the insulating layer 29 exposed by each of the openings 61 are roughened.

Figure 13:
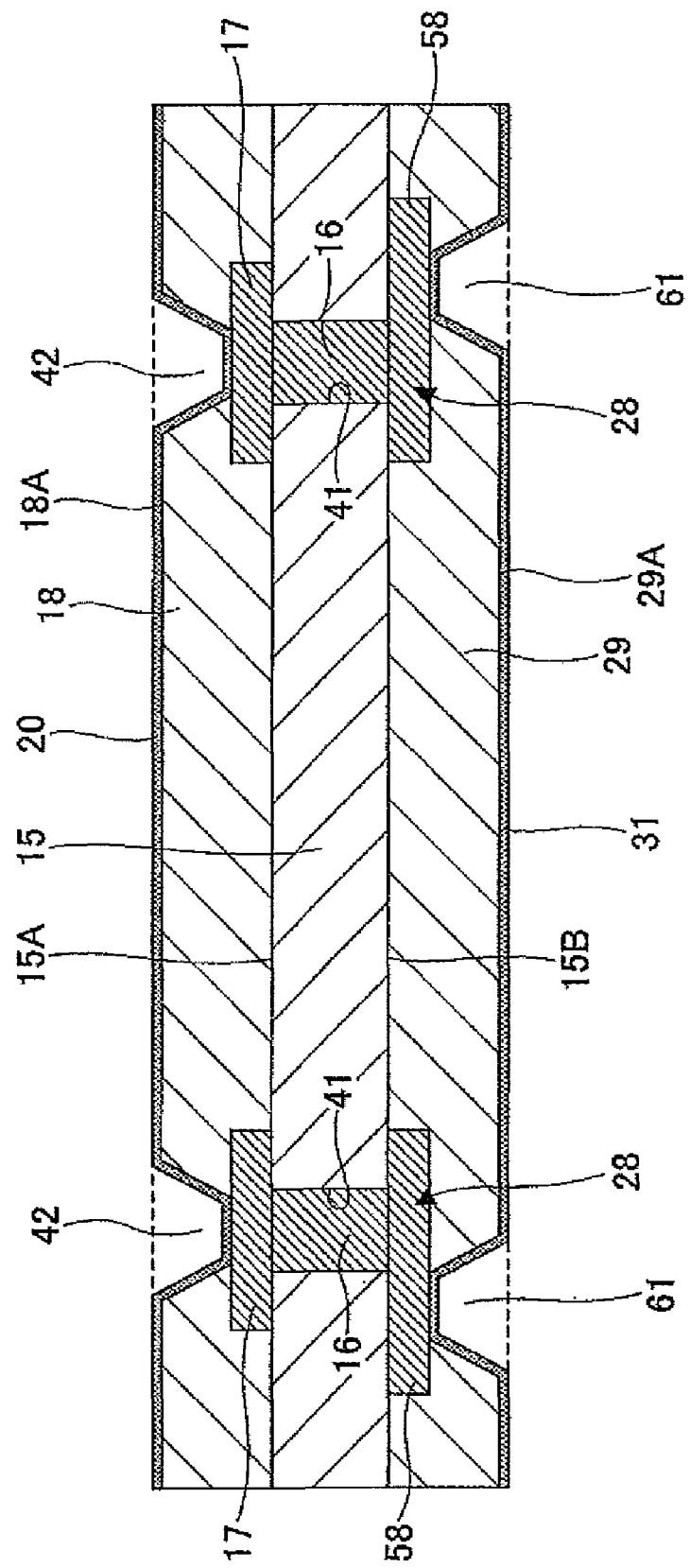
FIG. 13 is a third view showing the manufacturing method of the wiring board of the first embodiment of the present invention.

Next, in a step shown in FIG. 13, the sticking layer 20 is formed so as to cover the roughened surface of the insulating layer 18 and the upper surfaces of the pads 17 exposed by the opening parts 42. In addition, the sticking layer 31 is formed so as to cover the roughened surface of the insulating layer 29 and the lower surfaces of the pads 58 exposed by the opening parts 61 (Sticking layer forming step).

For example, a NiCu alloy layer, a metal layer made of Ni, Ti, Ta, W, or V, an alloy layer including Ni, Ti, Ta, W, or V, or the like can be used as the sticking layer 20 or 31. In the case where the NiCu alloy layer is used as the sticking layer 20 or 31, the thickness of the sticking layer 20 or 31 may be, for example, approximately 30 nm through approximately 100 nm. In addition, in the case where NiCu alloy layer is used as the sticking layer 20 or 31, the content of Ni in the NiCu alloy can be, for example, approximately 25 wt % through approximately 33 wt %.

The sticking layer 20 or 31 may be formed by using a sputtering method. By forming the sticking layer 20 or 31 by using the sputtering method, in a case where the sticking layer 20 or 31 is formed by an alloy, it is possible to easily control the composition ratio of the metal forming the sticking layer 20 or 31.

Figure 14:
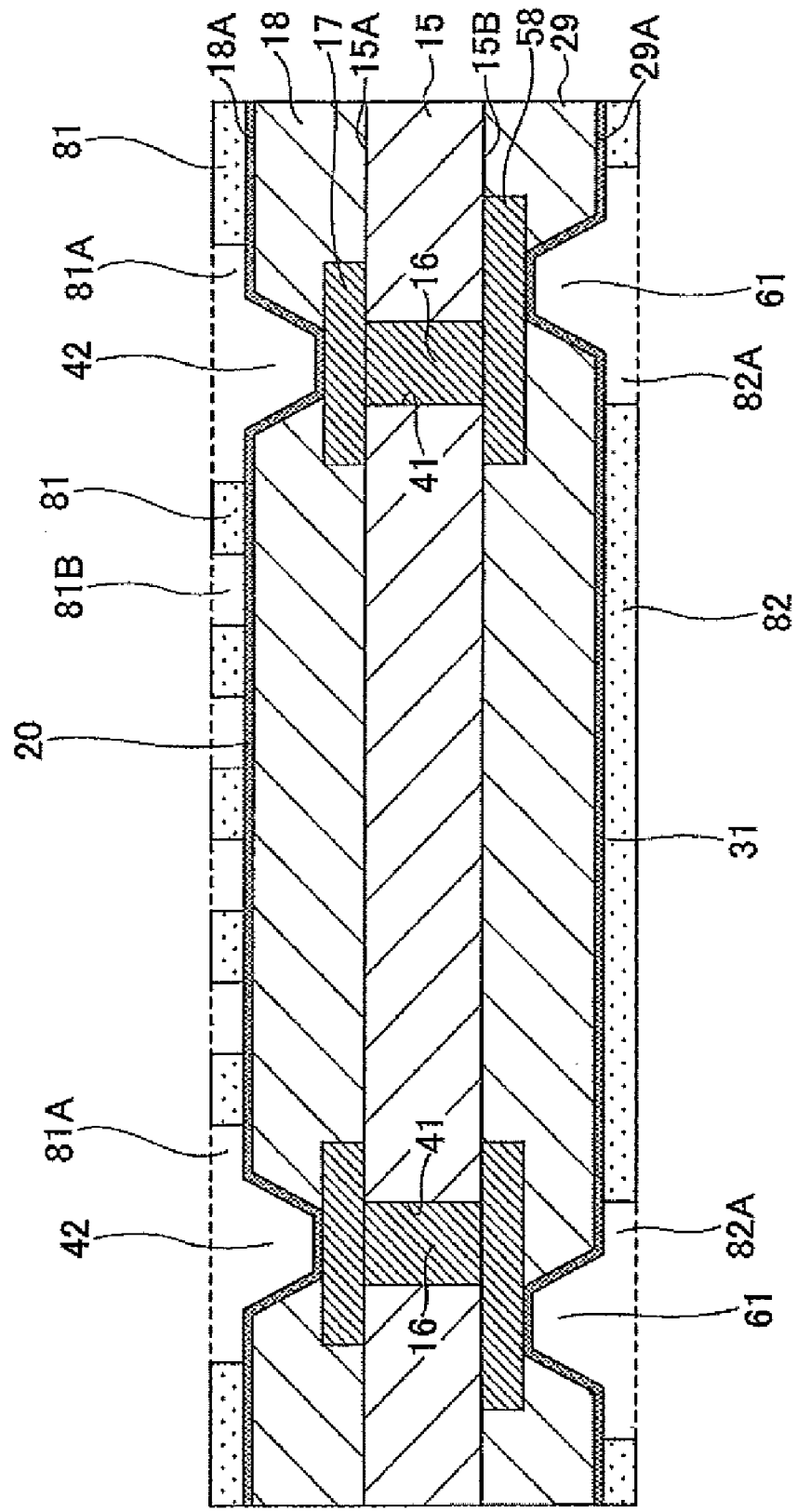
FIG. 14 is a fourth view showing the manufacturing method of the wiring board of the first embodiment of the present invention.

Next, in a step shown in FIG. 14, the resist film having the openings 81A and 81B for forming the wiring is formed on the upper surface of the sticking layer 20. The resist film 82 having the openings 82A is formed on the lower surface of the sticking layer 31 (Resist film forming step). At this time, each of the openings 81A for forming the wiring is formed so as to expose the upper surface of the sticking layer 20 of a part corresponding to an area where the wiring 22 is formed. In addition, each of the openings 81B for forming the wiring is formed so as to expose the upper surface of the sticking layer 20 of a part corresponding to an area where the wiring 23 is to be formed. Furthermore, each of the opening 82A is formed so as to expose the lower surface of the sticking layer 31 of a part corresponding to an area where the outside connection pad 33 is to be formed.

Figure 15:
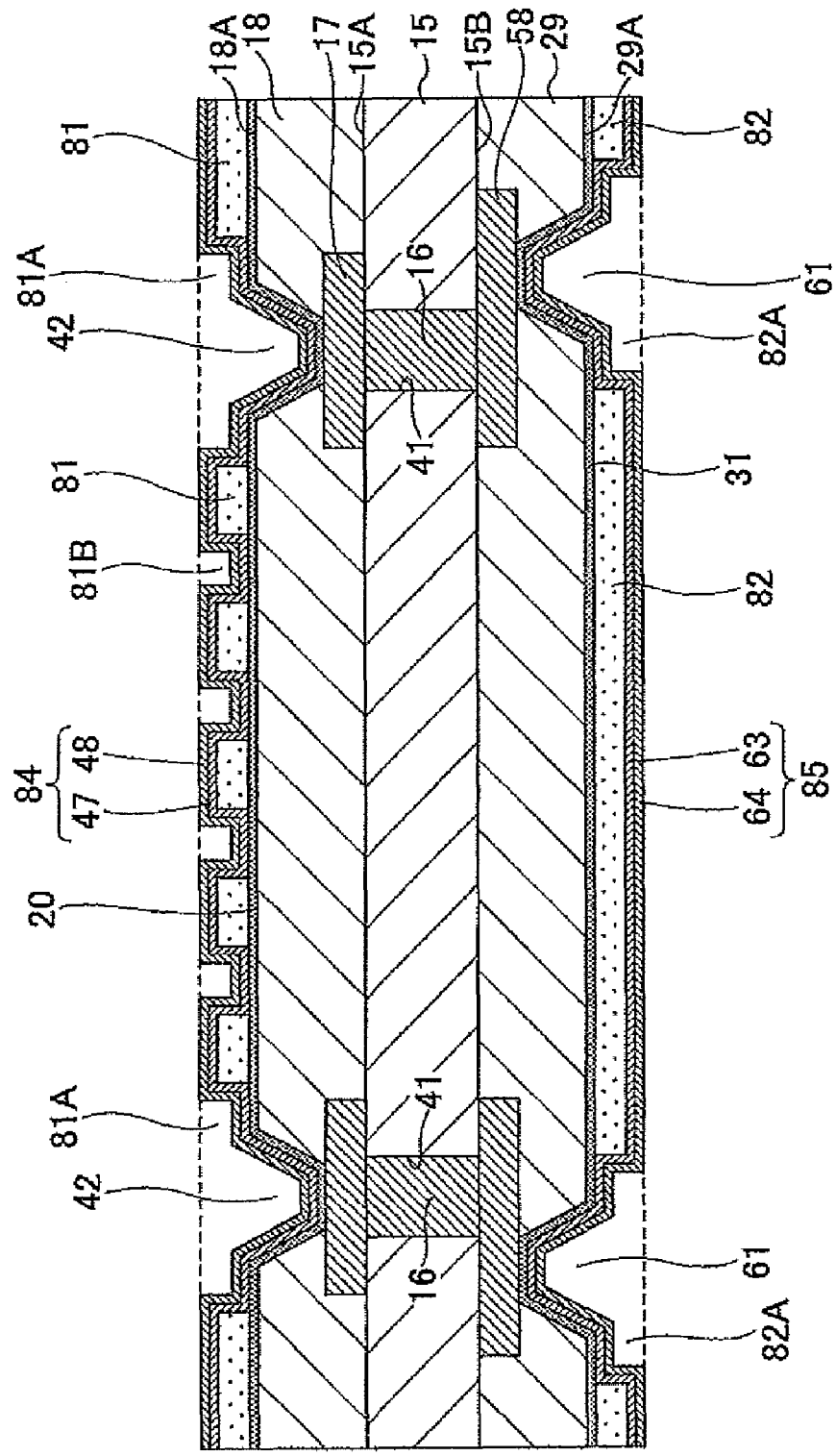
FIG. 15 is a fifth view showing the manufacturing method of the wiring board of the first embodiment of the present invention.

Next, in a step shown in FIG. 15, the protection metal layer 47 which is not etched easier than the sticking layers 20 and 31 is formed so as to cover the upper surface of the resist film 81, the upper surface of the sticking layer 20 and the side surface of the resist film 81 forming the openings 81A for forming the wiring, and the upper surface of the sticking layer 20 provided in the openings 42. In addition, the protection metal layer 63 which is not etched easier than the sticking layers 20 and 31 is formed so as to cover the lower surface of the resist film 82, the side surface of the sticking layer 31 and the side surface of the resist film 82 forming the openings 82A for forming the wiring, and the lower surface of the sticking layer 31 provided in the openings 61 (protection film metal layer forming step).

Thus, the protection metal layer 47 which may not be etched easier than the sticking layers 20 and 31 is provided at parts corresponding to the side walls of the wirings 22 and 23. Accordingly, in a step shown in FIG. 19 (sticking layer removing step) discussed below, when unnecessary parts of the sticking layers 20 and 31 are removed by etching, the protection metal layer 47 works as an etching stopper layer. Hence, it is possible to prevent the seed layer 48 and the plating film 49 provided inside the protection metal layer 47 from being etched. Accordingly, it is possible to set the width of the wirings 22 and 23 formed after the sticking layer removing step to a designated wiring width (width in design).

Thus, the protection metal film 63 which may not be etched easier than the sticking layers 20 and 31 is provided at parts corresponding to the side wall of the outside connection pads 33. Accordingly, in a step shown in FIG. 19 (sticking layer removing step) discussed below, when unnecessary parts of the sticking layers 20 and 31 are removed by etching, the protection metal layer 63 works as an etching stopper layer. Hence, it is possible to prevent the seed layer 64 and the plating film 65 provided inside the protection metal layer 63 from being etched. Accordingly, it is possible to set the width of the outside connection pads 33 formed after the sticking layer removing step to a designated wiring width (width in design).

For example, a NiCu alloy layer, a metal layer made of Ni, Ti, Ta, W, or V, an alloy layer including Ni, Ti, Ta, W, or V, or the like can be used as the protection metal layer 47 or 63. In the case where the NiCu alloy layer is used as the sticking layer 20 or 31 and the protection metal layer 47 or 63, the content of Ni in the NiCu alloy forming the protection metal layer 47 or 63 may be greater than the content of Ni in the NiCu alloy forming the sticking layer 20 or 31.

Thus, by setting the content of Ni in the NiCu alloy forming the protection metal layer 47 or 63 to be greater than the content of Ni in the NiCu alloy forming the sticking layer 20 or 31, it is possible to make the etching rate of the protection metal layer 47 or 63 less than that of the sticking layer 20 or 31.

The protection metal layer 47 or 63 may be formed by using a sputtering method. By forming the protection metal layer 47 or 63 by using the sputtering method, in a case where the protection metal layer 47 or 63 is formed by an alloy, it is possible to easily control the composition ratio of the protection metal layer 47 or 63.

Figure 19:
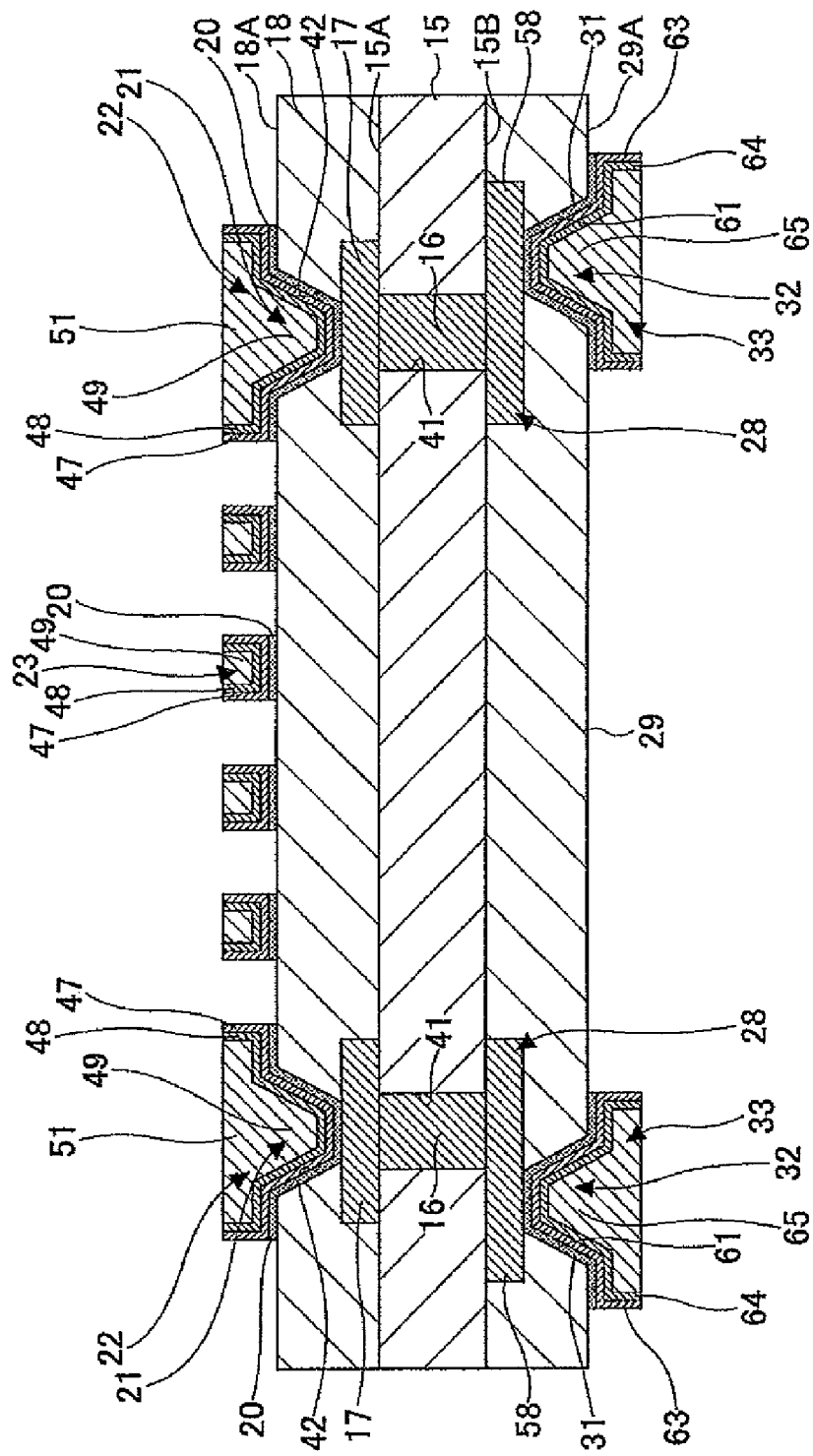
FIG. 19 is a ninth view showing the manufacturing method of the wiring board of the first embodiment of the present invention.

In addition, the thickness of the protection metal layer 47 or 63 is set so that the protection metal layer 47 or 63 retains on the side wall of the plating film 51 or 65 forming the outside connection pad 33 and the wiring 22 or 23 after the sticking layer removing step shown in FIG. 19. For example, the thickness of the protection metal layer 47 or 63 may be greater than that of the sticking layer 20 or 31, for example, twice or more than that of the sticking layer 20 or 31.

Thus, by setting the thickness of the protection metal layer 47 or 63 to be greater than that of the sticking layer 20 or 31, after the sticking layer removing step, it is possible to securely retain the protection metal layer 47 or 63 formed on the side wall of the wirings 22 or 23 or the side wall of the outside connection pad 33. In a case where the NiCu alloy layer is used as the sticking layer 20 or 31 and the protection metal layer 47 or 63, the thickness of the sticking layer 20 or 31 may be approximately 30 nm through approximately 100 nm and the thickness of the protection metal layer 47 or 63 may be, for example, approximately 300 nm through approximately 500 nm.

Next, the seed layer 48 is formed so as to cover the protection metal layer 47 and the seed layer 64 is formed so as to cover the protection metal layer 63 (Seed layer forming step). As a result of this, the metal layer 84 having the protection metal layer 47 and the seed layer 48 and the metal layer 85 having the protection metal layer 63 and the seed layer 64 are formed (Metal layer forming step).

The seed layer 48 or 64 can be formed by, for example, the sputtering method. In the case where the Cu layer is used as the seed layer 48 or 64, the thickness of the seed layer 48 or 64 may be, for example, approximately 300 nm through approximately 500 nm.

Figure 16:
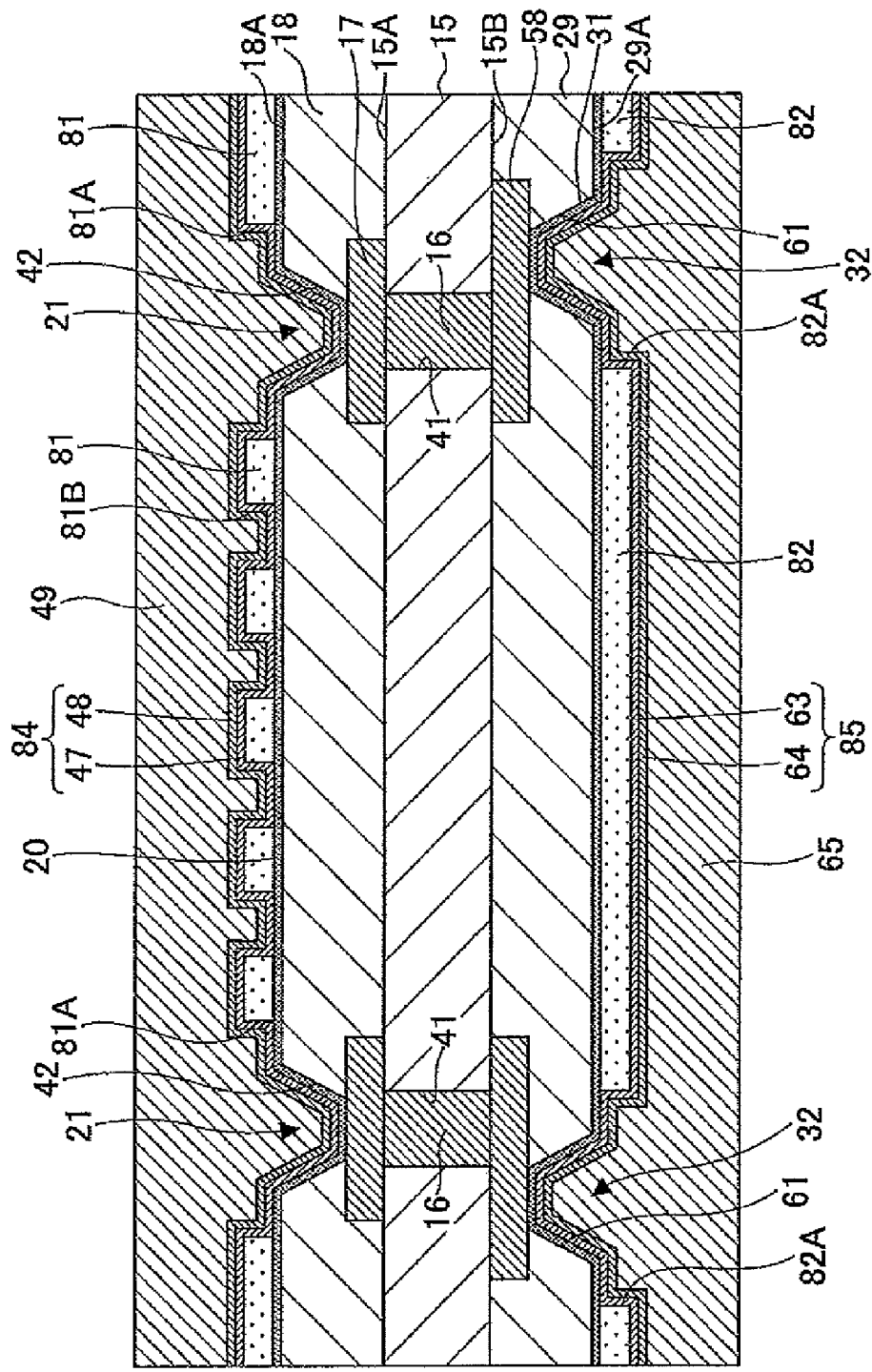
FIG. 16 is a sixth view showing the manufacturing method of the wiring board of the first embodiment of the present invention.

Next, in a step shown in FIG. 16, the plating film 49 filling the openings 42 and the openings 81A and 81B for forming the wiring is formed by an electrolytic plating method where the seed layer 48 is a feeding layer. The plating film 65 filling the openings 61 and 82A is formed by an electrolytic plating method where the seed layer 64 is a feeding layer (Plating film forming step). As a result of this, the via forming parts 21 and 32 are formed (via forming part forming step). For example, a Cu plating film can be used as the plating film 49 or 65.

Figure 17:
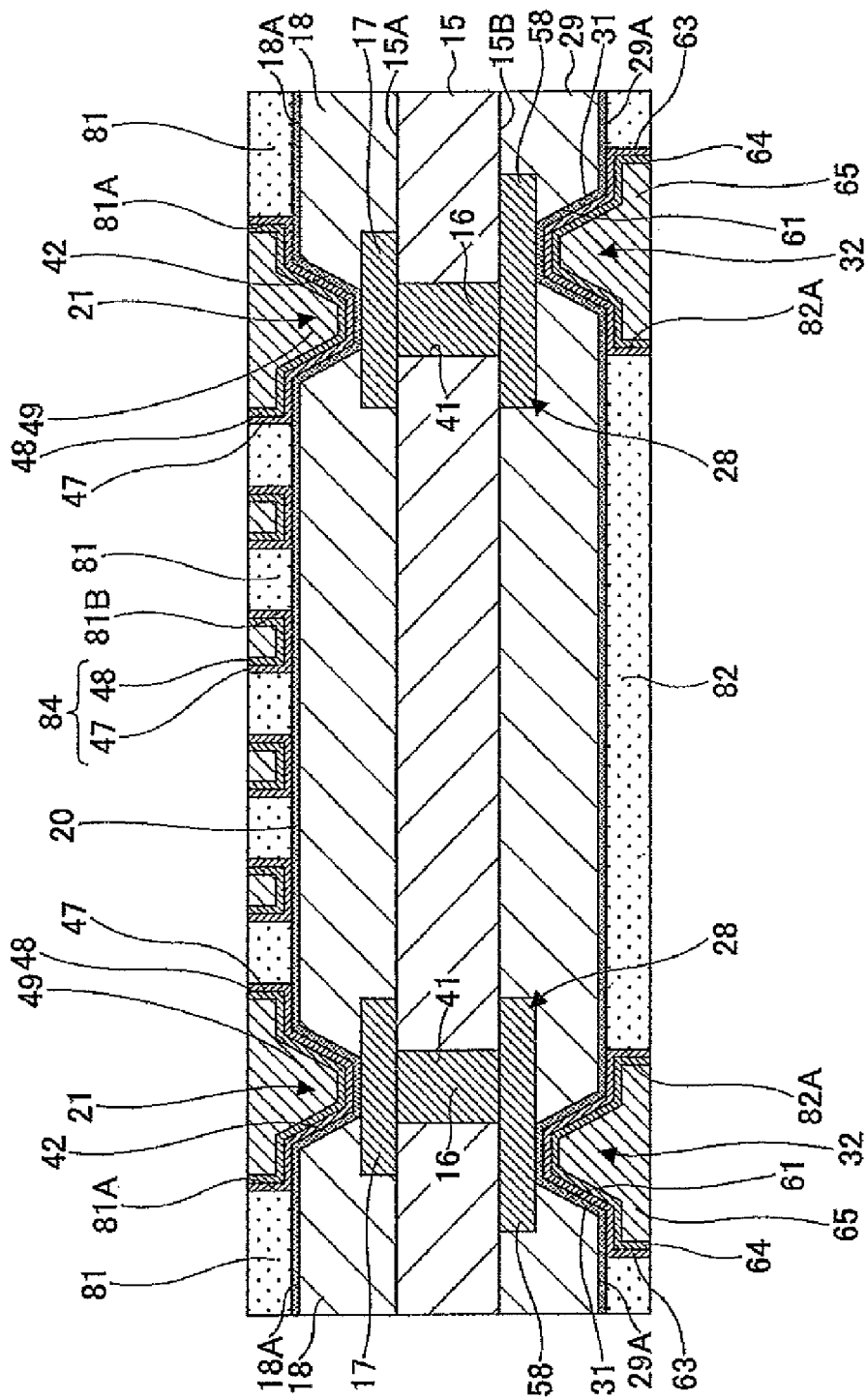
FIG. 17 is a seventh view showing the manufacturing method of the wiring board of the first embodiment of the present invention.

Next, in a step shown in FIG. 17, the metal layer 84 and the plating film 49 at a part formed above the upper surface of the resist film 81 shown in FIG. 16 are removed. In addition, the metal layer 85 and the plating film 65 at a part formed under the lower surface of the resist film 82 shown in FIG. 16 are removed. As a result of this, the metal layers 84 and 95 and the plating films 49 and 65 of unnecessary parts are removed. For example, a CMP (Chemical Mechanical Polishing) method or a blast method can be used for removal of the metal layers 84 and 95 and the plating films 49 and 65 of unnecessary parts.

Figure 18:
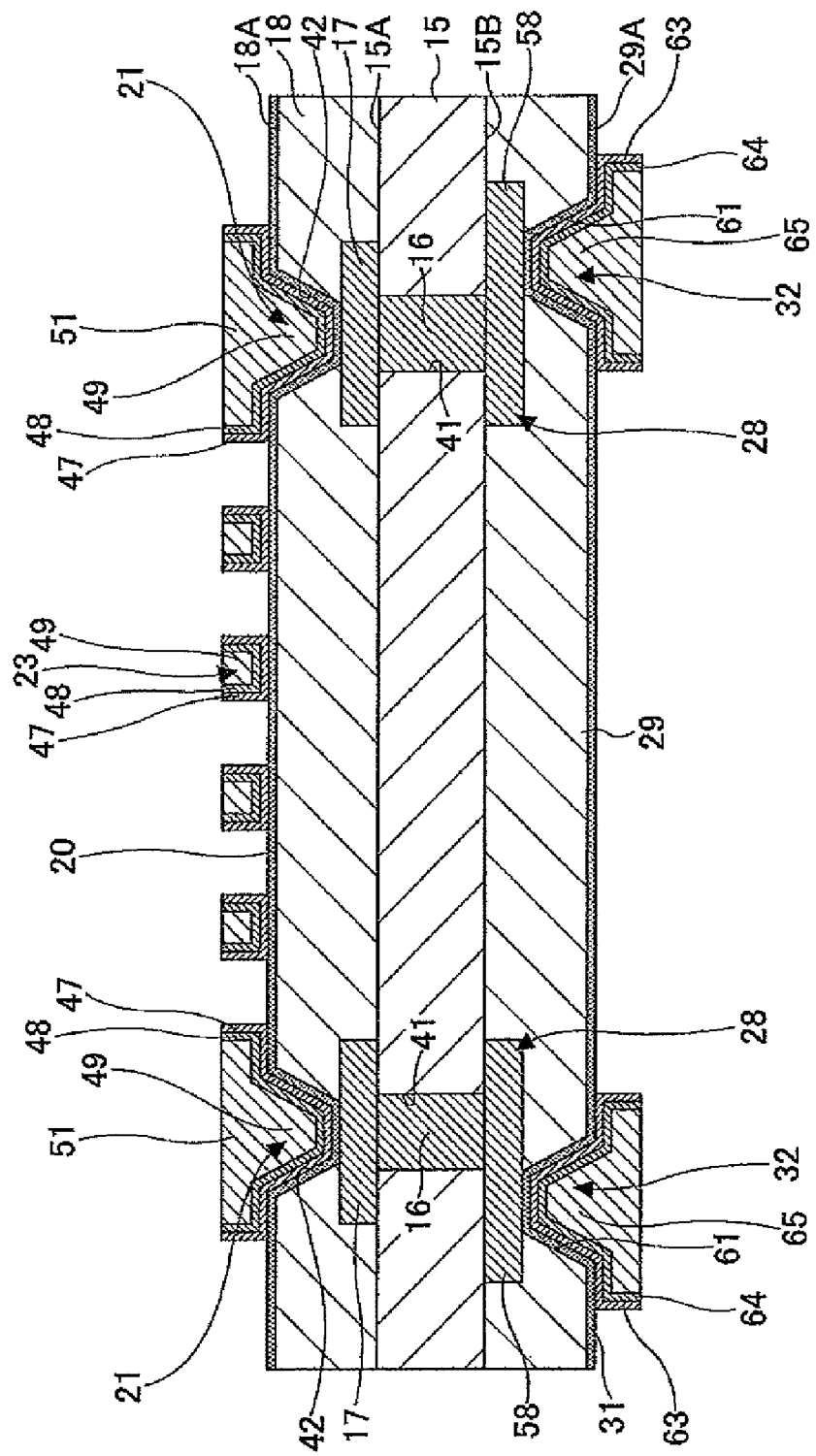
FIG. 18 is an eighth view showing the manufacturing method of the wiring board of the first embodiment of the present invention.

Next, in a step shown in FIG. 18, the resist films 81 and 82 shown in FIG. 17 are removed (Resist film removing step). After that, in a step shown in FIG. 19, the sticking layers 20 and 31 at unnecessary parts not covered by the protection metal layers 47 and 63 are removed by etching (Sticking layer removing step). More specifically, for example, the sticking layers 20 and 31 of the unnecessary parts are removed by wet etching. As etching liquid used for wet etching, for example, sulfuric acid group etching liquid (more specifically, for example, mixed liquid of sulfuric acid and hydrogen peroxide solution) can be used. At this time, as discussed above, the protection metal layer 47 formed on the side wall of the plating film 49 forming the wirings 22 and 23 via the seed layer 48 works as an etching stopper layer. Therefore, the widths of the wirings 22 and 23 formed after the sticking layer removing step can be designated lengths (length in design). Furthermore, as discussed above, the protection metal layer 63 formed on the side wall of the plating film 65 forming the outside connection pad 33 via the seed layer 64 works as an etching stopper layer. Therefore, the widths of the outside connection pad 33 formed after the sticking layer removing step can be a designated width (width in design).

Figure 20:
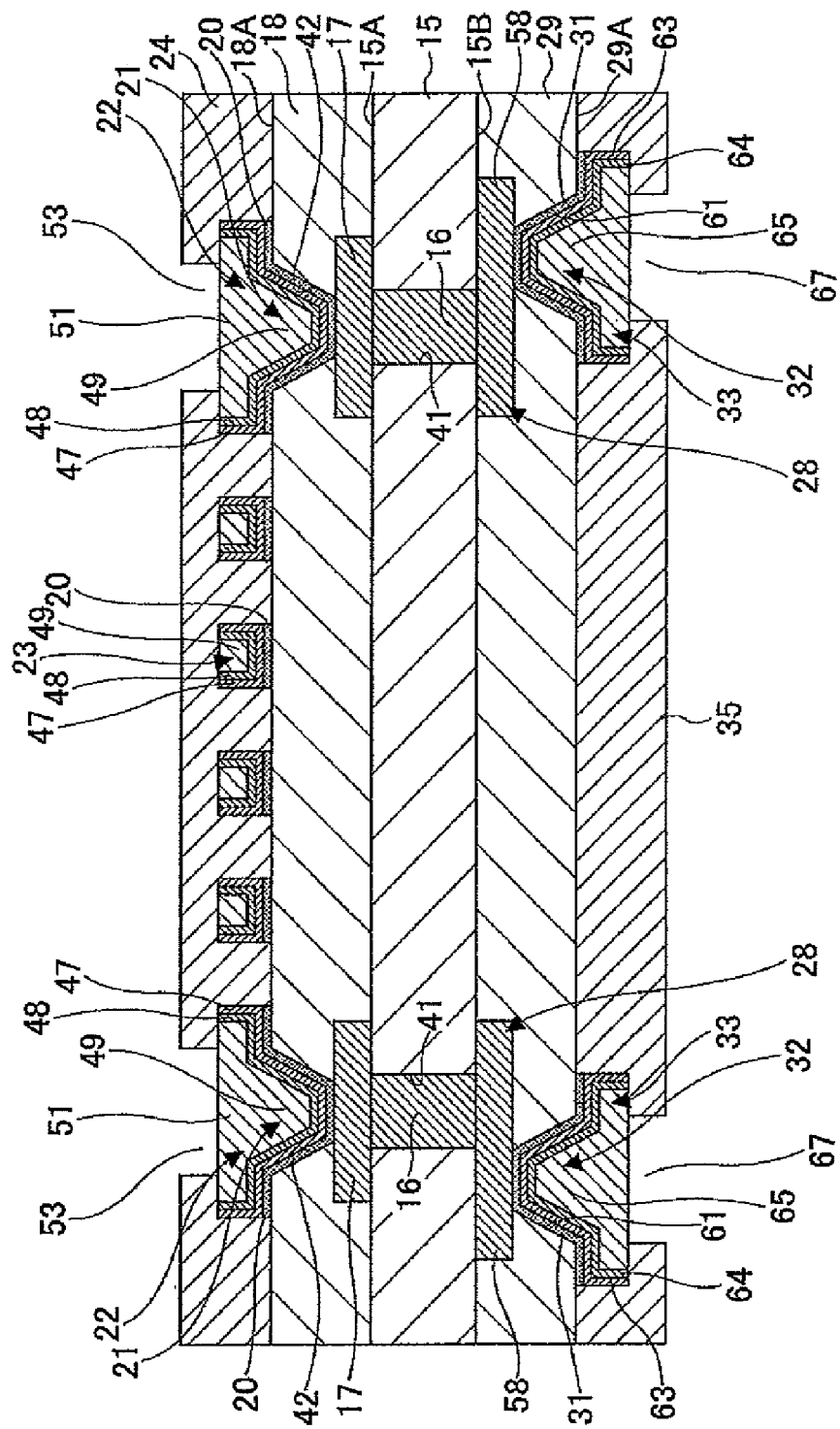
FIG. 20 is a tenth view showing the manufacturing method of the wiring board of the first embodiment of the present invention.

Next, in a step shown in FIG. 20, the solder resist layer 24 having the openings 53 exposing the upper surface of the pads 51 is formed on the upper surface 18A of the insulating layer 18. In addition, the solder resist layer 35 having the openings 67 exposing the lower surface of the outside pads 33 is formed on the lower surface 29A of the insulating layer 29.

Figure 21:
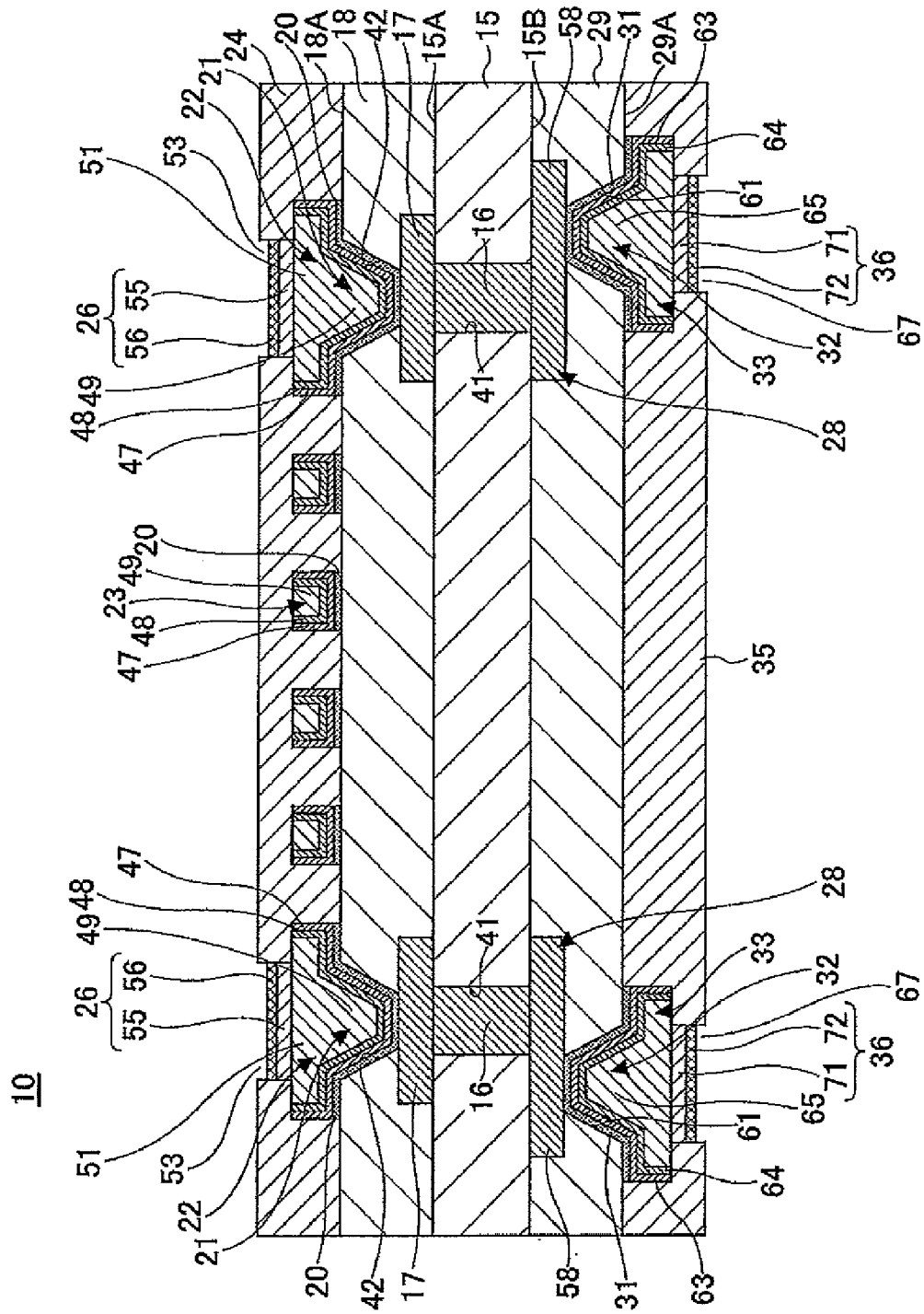
FIG. 21 is an eleventh view showing the manufacturing method of the wiring board of the first embodiment of the present invention.

Next, in a step shown in FIG. 21, the diffusion prevention film 26 is formed on the upper surface of the pads 51 exposed by the opening part 53. In addition, the diffusion prevention film 36 is formed on the lower surface of the outside connection pads 33 exposed by the opening part 67. More specifically, the diffusion prevention film 26 is formed by stacking the Ni layer 55 having the thickness of, for example, approximately 3 μm through approximately 5 μm and the Au layer 56 having the thickness of, for example, approximately 0.1 μm on the upper surface of the pads 51 exposed by the openings 53 in order by using, for example, an electrolytic plating method. In addition, the diffusion prevention film 36 is formed by stacking the Ni layer 71 having the thickness of, for example, approximately 3 μm through approximately 5 μm and the Au layer 72 having the thickness of, for example, approximately 0.1 μm on the lower surface of the outside connection pad 33 exposed by the opening 67 in order by using, for example, an electrolytic plating method. As a result of this, the wiring board 10 of the first embodiment of the present invention is manufactured.

According to the manufacturing method of the first embodiment of the present invention, the sticking layer 20 is formed so as to cover the upper surface 18A of the insulating layer 18 where the openings 42 are formed, the surface of the insulating layer 18 of a part forming the opening 42, and the upper surfaces of the pads 17. Then, the resist film 81 having the openings 81A and 81B exposing the upper surface of the sticking layer 20 of parts corresponding to the area where the wirings 22 and 23 are formed is formed on the upper surface of the sticking layer 20. After that, the protection metal layer 47 which is not etched easier than the sticking layer 20 is formed so as to cover the upper surface of the resist film 81, the side surface of the resist film 81 of parts forming the openings 81A and 81B and the upper surface of the sticking layer 20. Then, the seed layer 48 which covers the protection metal layer 47 is formed. Next, the openings 42 and the openings 81A and 81B for forming the wirings are filled with the plating film by the electrolytic plating method where the seed layer 48 is a feeding layer. After that, unnecessary protection metal layer 47, seed layer 48 and plating film 49 at a part formed above the upper surface of the resist film 81 are removed. Next, the resist film 81 is removed and then unnecessary sticking layer 20 of a part not covered with the protection metal layer 47 is etched and removed. As a result of this, the protection metal layer 47 formed on the side wall of the plating film 49 forming the wirings 22 and 23 via the seed layer 48 works as the etching stopper layer. Hence, the width of the wirings 22 and 23 formed after the sticking layer removing step can be the designated width (width in design).

In this embodiment, the built-up board with a core, the board where single insulating layers 18 and 19 are formed on the surface 15A and 15B, respectively, of the core substrate 15 is discussed as the wiring board 10. However, the present invention is not limited to this. The manufacturing method of the wiring board of the embodiment of the present invention can be applied to a built-up board with a core, the board where plural via-forming parts and wirings are provided in the plural insulating layers provided on the surfaces 15A and 15B of the core substrate 15.

In addition, in this embodiment, the built-up board with the core is discussed as the wiring board 10. However, the present invention is not limited to this. The manufacturing method of the wiring board of the embodiment of the present invention can be applied to a coreless board having the core substrate 15.

Furthermore, in a case where the protection metal layers 47 and 63 are made of materials having functions as seed layers, it is not necessary to provide the seed layers 48 and 64.

In addition, in this embodiment, the protection metal layer 63 is provided at a part corresponding to the side walls of the outside connection pads 33 and the via forming part 32. However, the present invention is not limited to this. The protection metal layer 63 may be provided, if necessary.

Second Embodiment

Figure 22:
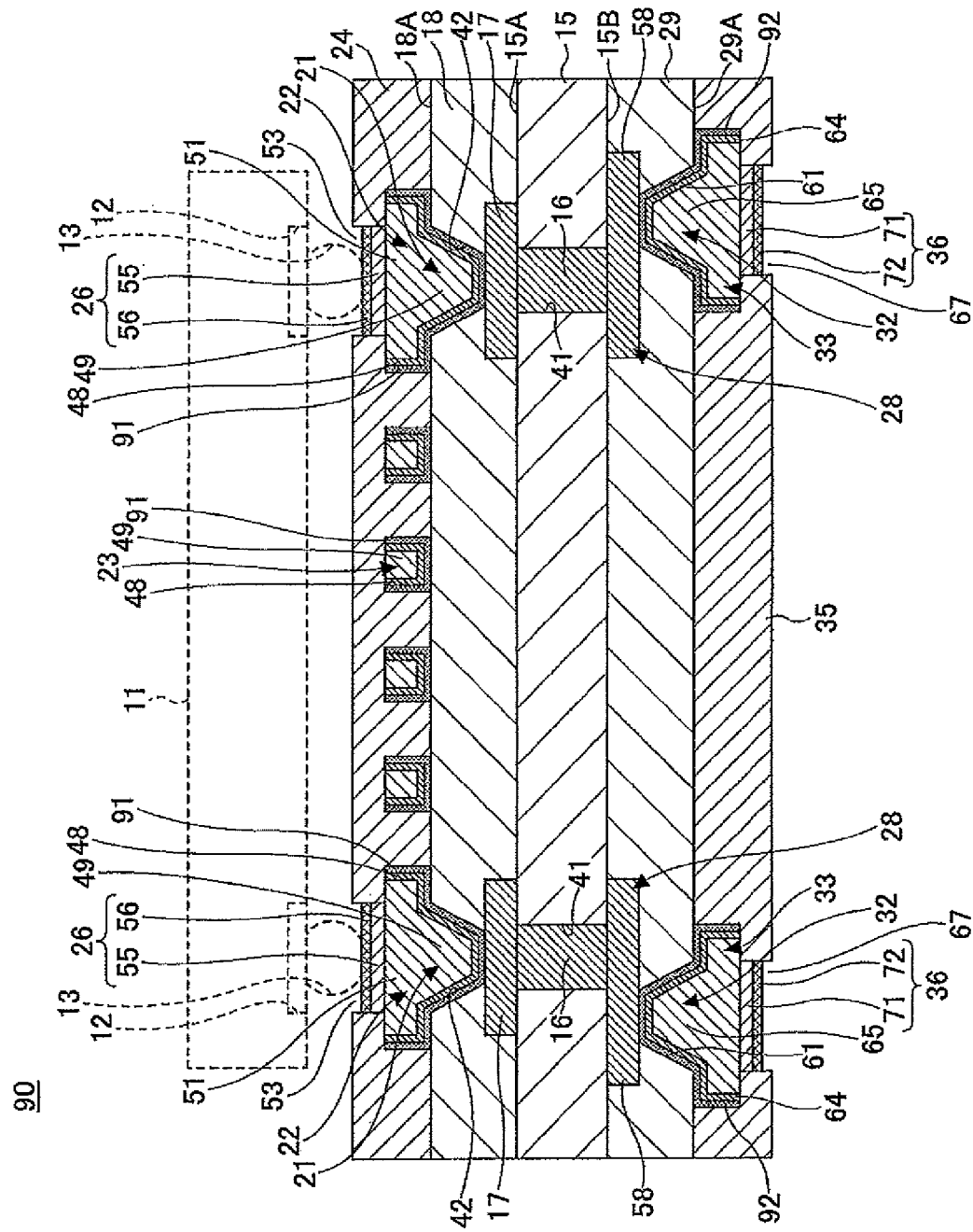
FIG. 22 is a cross-sectional view of a wiring board of a second embodiment of the present invention.

FIG. 22 is a cross-sectional view of a wiring board of a second embodiment of the present invention. In FIG. 22, parts that are the same as the parts shown in FIG. 10 are given the same reference numerals, and explanation thereof is omitted.

Referring to FIG. 22, a wiring board 90 of the second embodiment of the present invention has the same structure as that of the wiring board 10 of the first embodiment of the present invention except the following. That is, in the wiring board 90 of the second embodiment, the sticking layers 20 and 31 of the wiring board 10 are not provided; a sticking layer 91 instead of the protection metal layer 47 is provided; and a sticking layer 92 instead of the protection metal layer 63 is provided.

For example, a NiCu alloy layer, a metal layer made of Ni, Ti, Ta, W, or V, an alloy layer including Ni, Ti, Ta, W, or V, or the like can be used as the sticking layers 91 or 92. In the case where the NiCu alloy layer is used as the sticking layer 91 or 92, the thickness of the sticking layer 91 or 92 may be, for example, approximately 30 nm through approximately 100 nm. In addition, in the case where the NiCu alloy layer is used as the sticking layer 91 or 92, the content of Ni in the NiCu alloy can be, for example, approximately 25 wt % through approximately 33 wt %.

FIG. 23 through FIG. 28 are first through sixth views showing a manufacturing method of the wiring board of the second embodiment of the present invention. In FIG. 23 through FIG. 28, parts that are the same as the parts shown in FIG. 22 are given the same reference numerals, and explanation thereof is omitted.

Referring to FIG. 23 through FIG. 28, a manufacturing method of the wiring board 90 of the second embodiment of the present invention is discussed. First, the same steps as the steps shown in FIG. 11 and FIG. 12 (including the pad forming step) are applied so that a structural body shown in FIG. 12 is manufactured.

Figure 23:
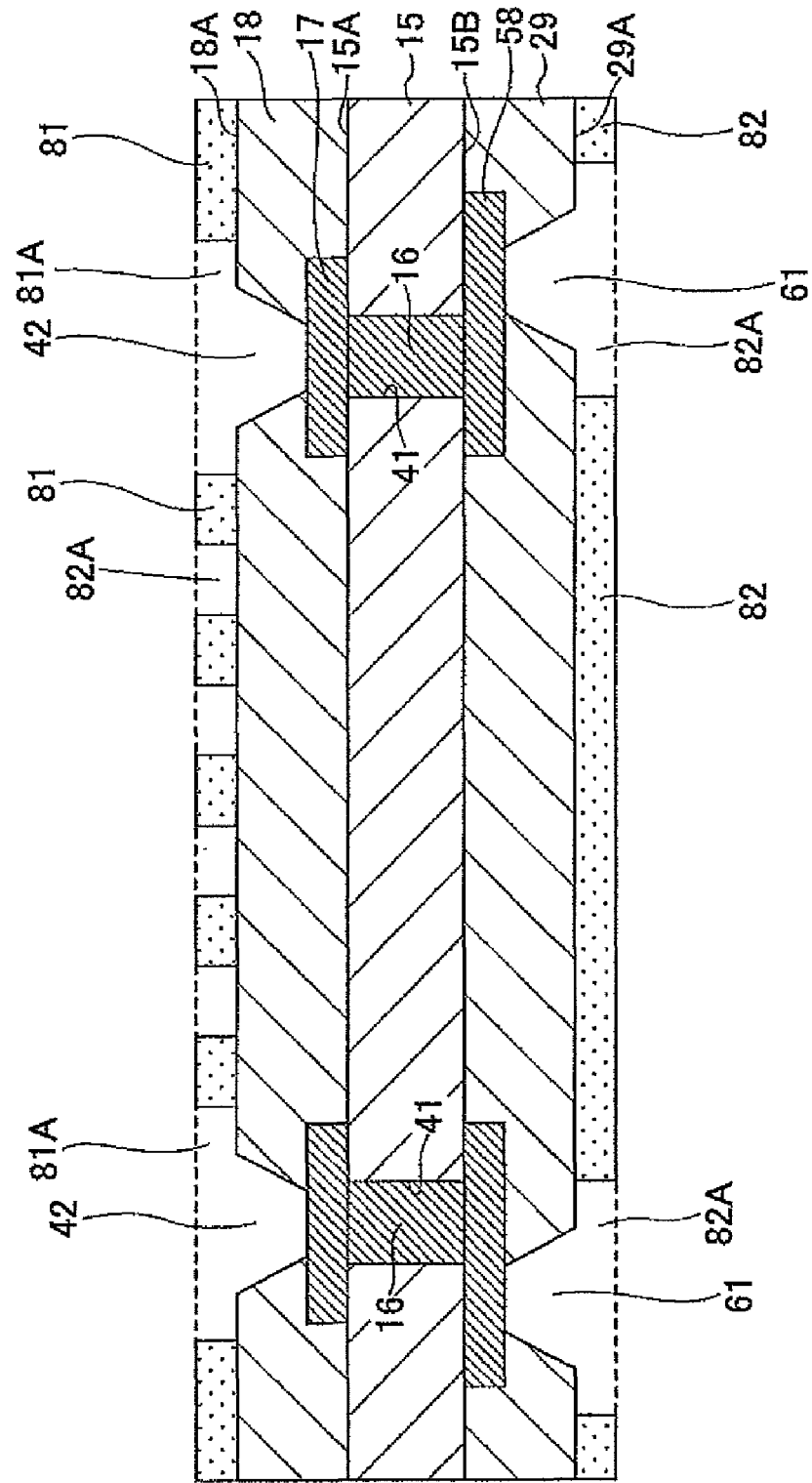
FIG. 23 is a first view showing a manufacturing method of the wiring board of the second embodiment of the present invention.

Next, in a step shown in FIG. 23, the solder resist layer 81 having the openings 81A and 81B is formed on the upper surface 18A of the insulating layer 18. In addition, the solder resist layer 82 having the opening 82A is formed on the lower surface 29A of the insulating layer 29 (resist film forming step).

Figure 24:
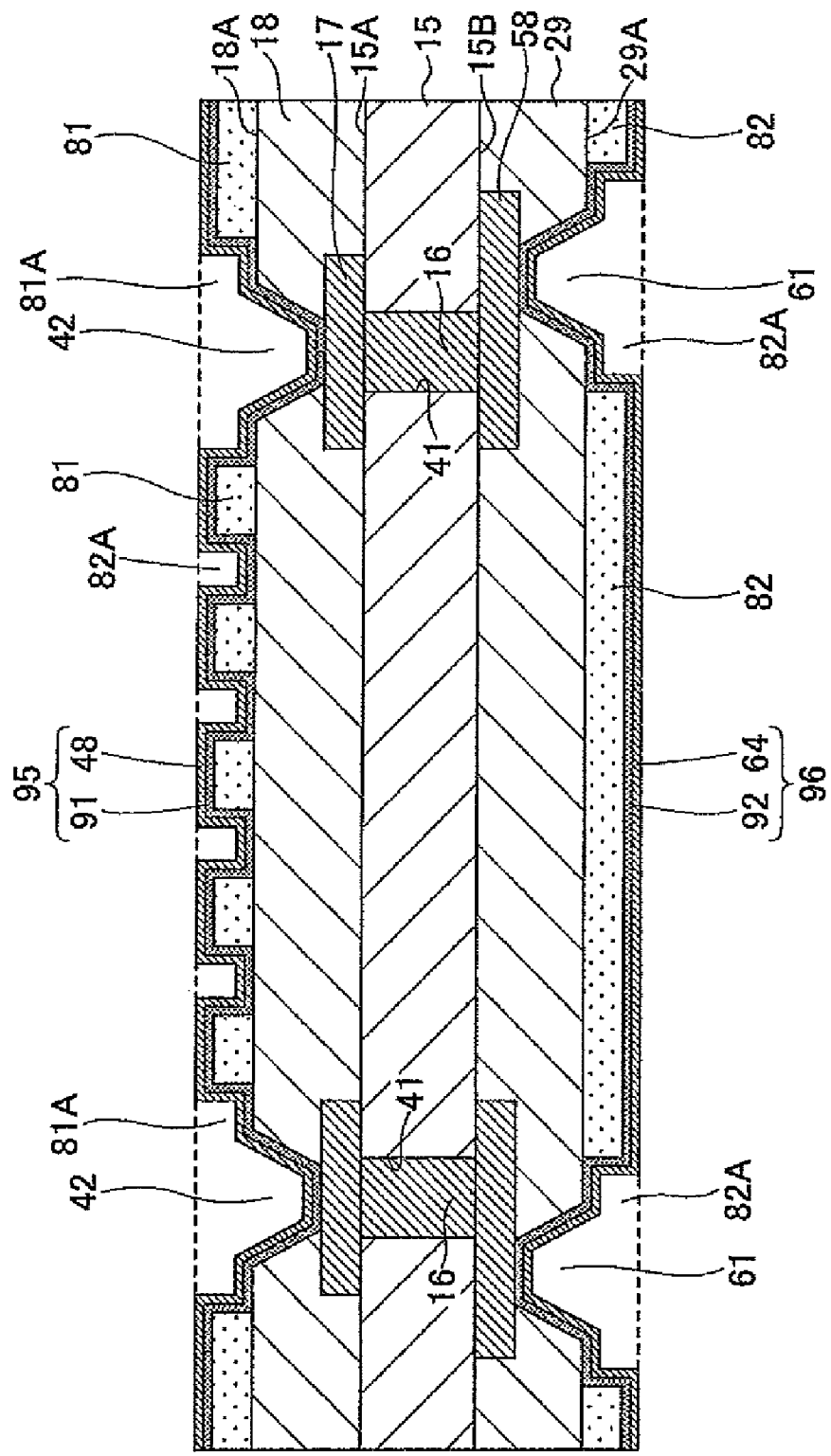
FIG. 24 is a second view showing the manufacturing method of the wiring board of the second embodiment of the present invention.

Next, in a step shown in FIG. 24, the sticking layer 91 is formed so as to cover the upper surface of the resist film 81, the side surface of the resist film 81 and the upper surface 18A of the insulating layer 18 forming the openings 81A and 81B for forming the wirings, and the surface of the insulating layer 18 and the upper surface of the pad 17 forming the opening 42. In addition, the sticking layer 92 is formed so as to cover the lower surface of the resist film 82, the side surface of the resist film 82 and the lower surface 29A of the insulating layer 29 forming the opening 82A, and the surface of the insulating layer 92 and the lower surface of the pad 58 forming the opening 61 (Sticking layer forming step).

The sticking layers 91 and 92 can be formed by a sputtering method, for example.

For example, a NiCu alloy layer, a metal layer made of Ni, Ti, Ta, W, or V, an alloy layer including Ni, Ti, Ta, W, or V, or the like can be used as the sticking layer 91 or 92. In the case where the NiCu alloy layer is used as the sticking layer 91 or 92, the thickness of the sticking layer 91 or 92 may be, for example, approximately 30 nm through approximately 100 nm. In addition, in the case where NiCu alloy layer is used as the sticking layer 91 or 92, the content of Ni in the NiCu alloy can be, for example, approximately 25 wt % through approximately 33 wt %.

Next, the seed layer 48 configured to cover the sticking layer 91 and the seed layer 64 configured to cover the sticking layer 92 are formed (Seed layer forming step). As a result of this, the metal layer 95 having the seed layer 48 and the sticking layer 91 and the metal layer 96 having the seed layer 64 and the sticking layer 92 are formed (Metal layer forming step). The seed layer 48 or 64 can be formed by, for example, the sputtering method. In the case where the Cu layer is used as the seed layer 48 or 64, the thickness of the seed layer 48 or 64 may be, for example, approximately 300 nm through approximately 500 nm.

Figure 25:
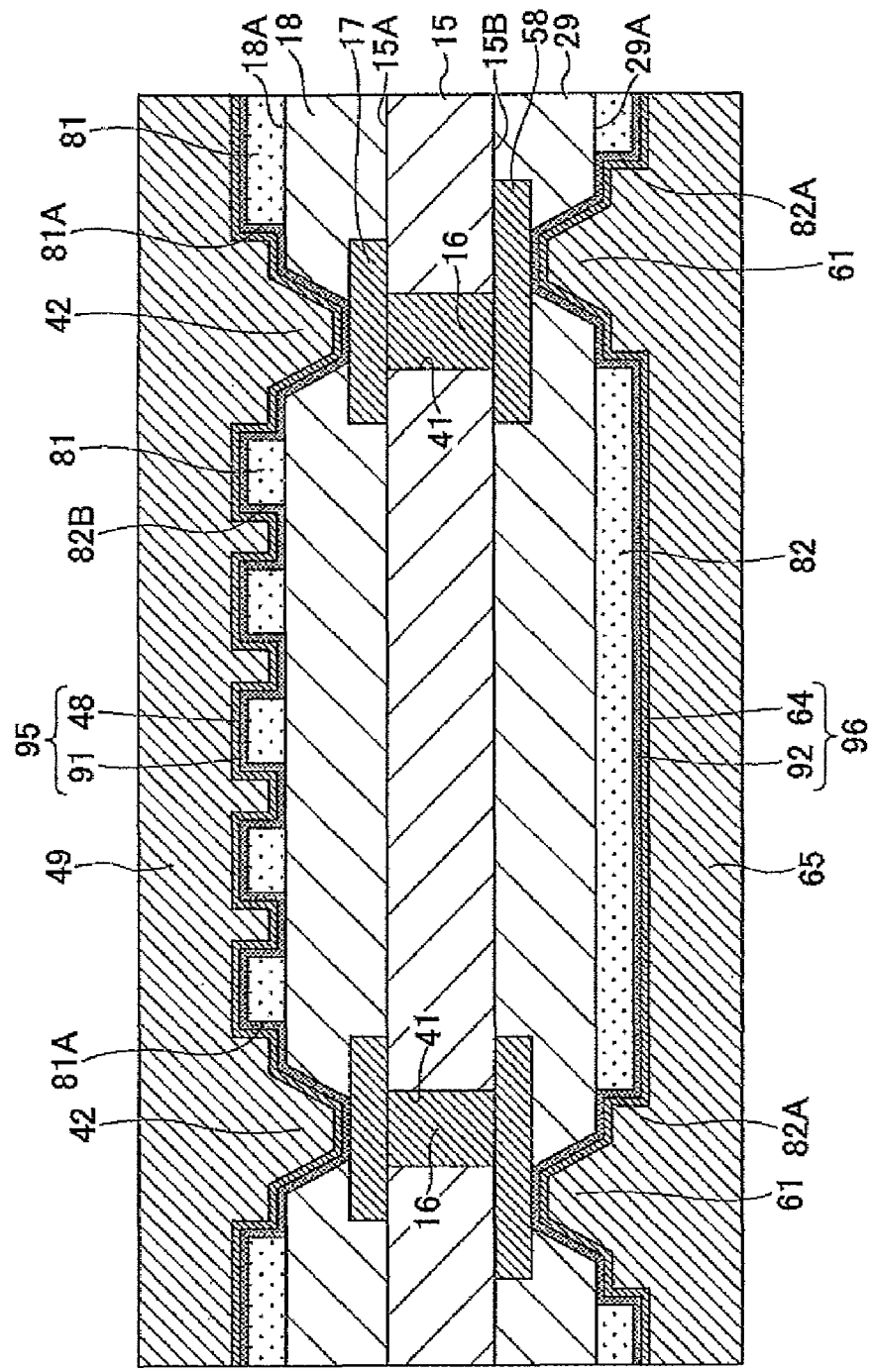
FIG. 25 is a third view showing the manufacturing method of the wiring board of the second embodiment of the present invention.

Next, in a step shown in FIG. 25, the plating film 49 filling the opening 42 and the openings 81A and 81B for forming the wirings is formed by an electrolytic plating method where the seed layer 48 is a feeding layer. The plating film 65 filling the openings 61 and 82A is formed by an electrolytic plating method where the seed layer 64 is a feeding layer (Plating film forming step). As a result of this, the via forming parts 21 and 32 are formed (via forming part forming step). For example, a Cu plating film can be used as the plating film 49 or 65.

Figure 26:
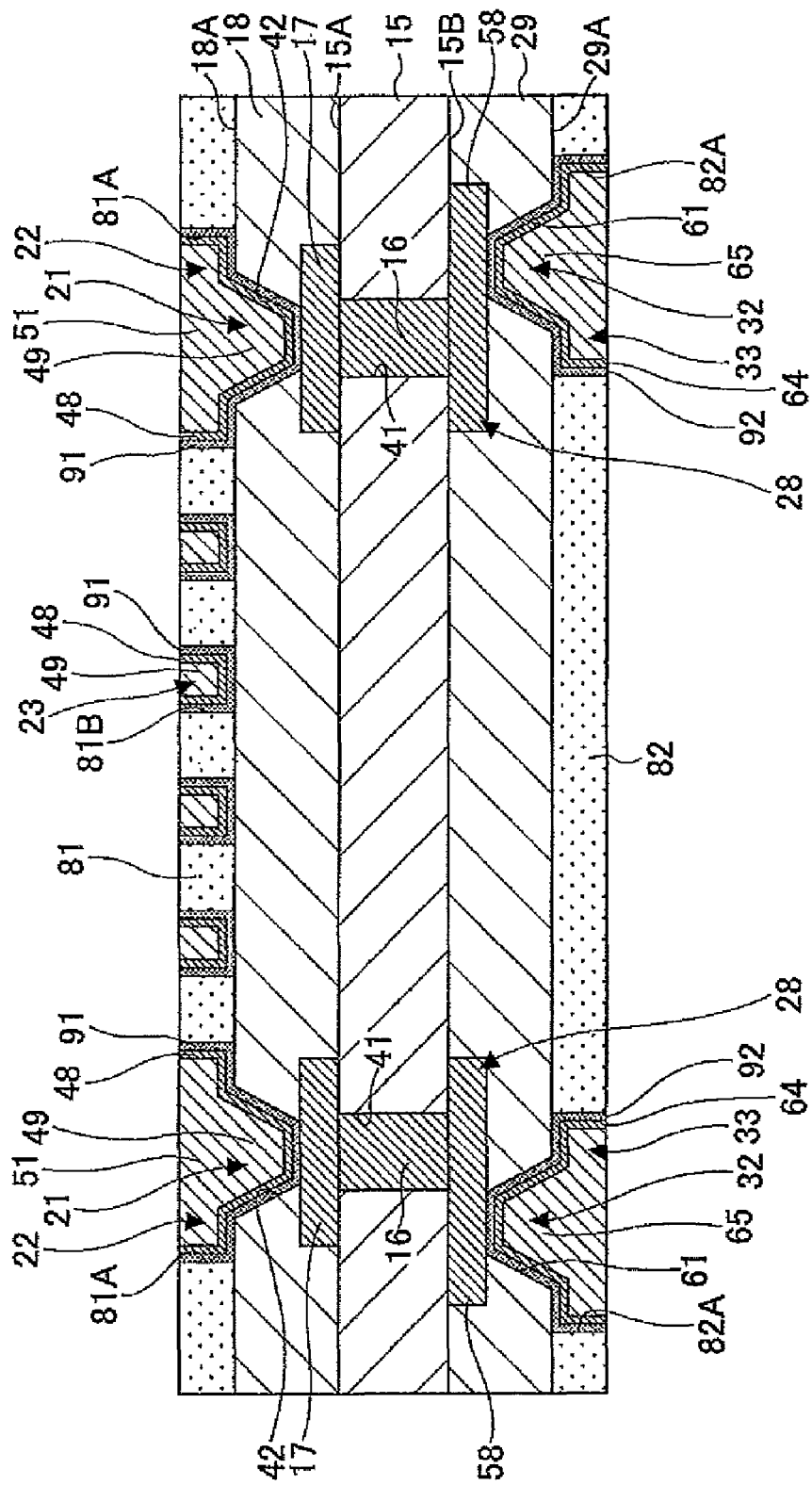
FIG. 26 is a fourth view showing the manufacturing method of the wiring board of the second embodiment of the present invention.

Next, in a step shown in FIG. 26, the metal layer 95 and the plating film 49 of the unnecessary part formed above the upper surface of the resist film 81, shown in FIG. 25, are removed. In addition, the metal layer 96 and the plating film 65 of the unnecessary part formed under the lower surface if the resist film 82, shown in FIG. 25, are removed. As a result of this, the wirings 22 and 23 and the outside connection pads 33 are formed (Wiring forming step).

Thus, the wirings 22 and 23 are formed without using the etching method so that the side walls of the wirings 22 and 23 are not etched. Hence, the widths of the wirings 22 and 23 can be the designated widths (widths in design). For example, a CMP (Chemical Mechanical Polishing) method or a blast method can be used for removal of the metal layers 95 and 96 and the plating films 49 and 65 of unnecessary parts.

Figure 27:
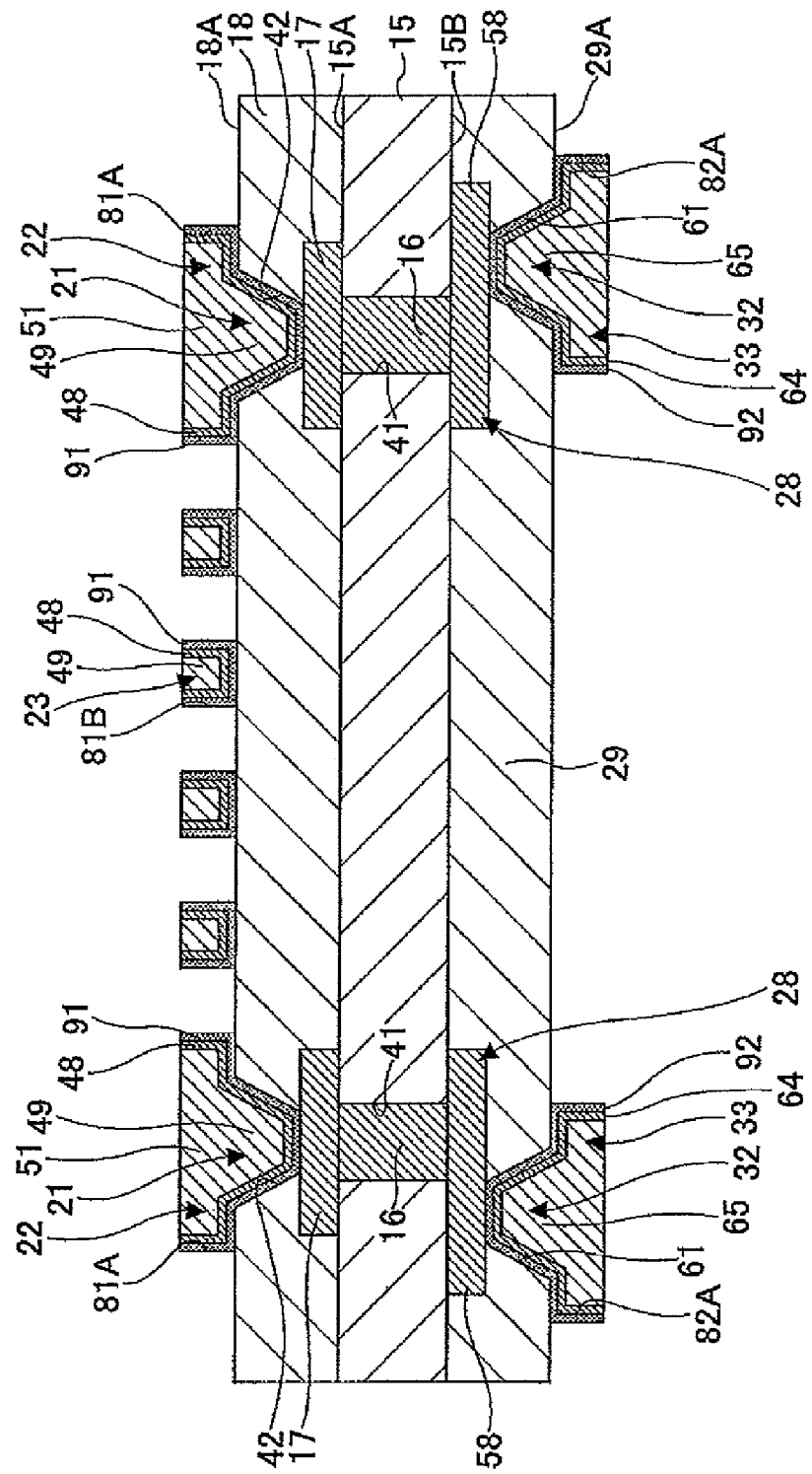
FIG. 27 is a fifth view showing the manufacturing method of the wiring board of the second embodiment of the present invention.
Figure 28:
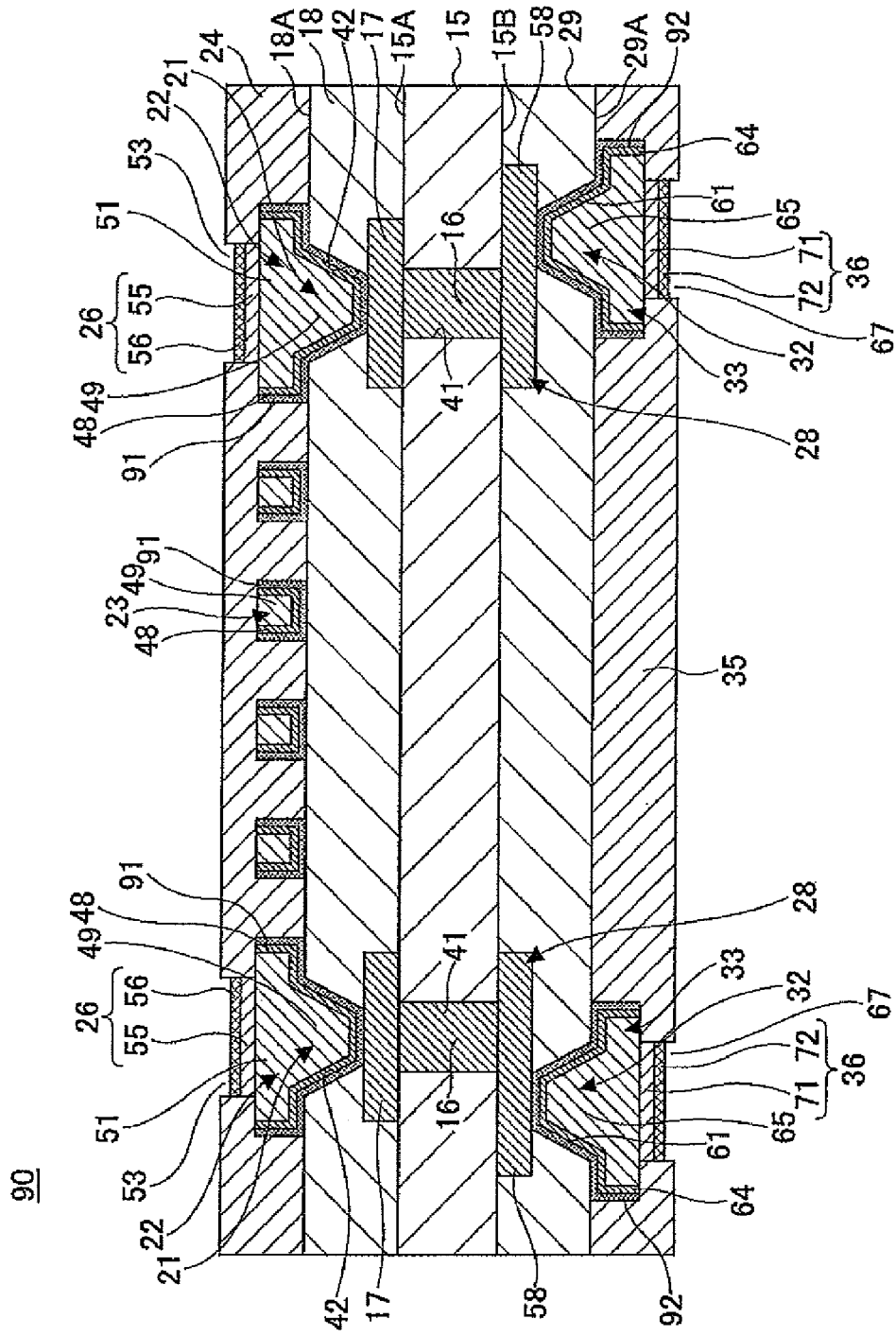
FIG. 28 is a sixth view showing the manufacturing method of the wiring board of the second embodiment of the present invention.

Next, in a step shown in FIG. 27, the resist films 81 and 82 shown in FIG. 26 are removed (Resist film removing step). Then, the same steps shown in FIG. 20 and FIG. 21 are performed in a step shown in FIG. 28 so that the solder resist films 24 and 35 and the diffusion prevention films 26 and 36 are formed. As a result of this, the wiring board 90 of the second embodiment of the present invention can be manufactured.

According to the manufacturing method of the second embodiment of the present invention, the resist film 81 having the openings 81A and 81B corresponding to the areas where the wirings 22 and 23 are formed is formed on the upper surface 18A of the insulating layer 18 where the openings 42 are formed. Next, the sticking layer 91 is formed so as to cover the upper surface of the resist film 81, the side surface of the resist film 81 and the upper surface 18A of the insulating layer 18 of a part forming the openings 81A and 81b, the surface of the insulating layer 18 of a part forming the openings 42, and the upper surfaces of the pads 17. Then, the seed layer 48 which covers the sticking layer 91 is formed. Next, the openings 42 and the openings 81A and 81B for forming the wirings are filled with the plating film by the electrolytic plating method where the seed layer 48 is a feeding layer. After that, unnecessary sticking layer 91, seed layer 48 and plating film 49 at a part formed above the upper surface of the resist film 81 are removed. As a result of this, the wirings 22 and 23 can be formed without using the etching method. Hence, the width of the wirings 22 and 23 can be the designated width (width in design).

In this embodiment, the built-up board with a core, the board where single insulating layers 18 and 19 are formed on the surface 15A and 15B of the core substrate 15 is discussed as the wiring board 90. However, the present invention is not limited to this. The manufacturing method of the wiring board of the embodiment of the present invention can be applied to a built-up board with a core, the board where plural via-forming parts and wirings are provided in the plural insulating layers provided on the surfaces 15A and 15B of the core substrate 15.

In addition, in this embodiment, the built-up board with the core is discussed as the wiring board 90. However, the present invention is not limited to this. The manufacturing method of the wiring board of the embodiment of the present invention can be applied to a coreless board having the core substrate 15.

Thus, according to the embodiments of the present invention, the sticking layer covering the upper surface of the insulating layer is formed, and then the resist film having the opening exposing the upper surface of the sticking layer of a part corresponding to an area where the wiring is to be formed is formed on the upper surface of the sticking layer. After that, the metal layer more difficult to etch than the sticking layer is formed so as to cover the upper surface of the resist film and cover the side surface of the resist film forming the openings for forming the wiring and the upper surface of the sticking layer. Next, the openings for forming the wirings are filled with the plating film by an electrolytic plating method where the metal layer is a feeding layer. Then, after the plating film and the metal layer formed above the upper surface of the resist film are removed, the resist film is removed and then the sticking layer of an unnecessary part not covered with the metal layer is removed. When unnecessary sticking layer is removed by etching, the metal layer formed at a part corresponding to the side walls of the wiring works as an etching stopper layer. Accordingly, it is possible to prevent the side walls of the wiring from being etched. Hence, it is possible to form the wiring having the designated width (width in design).

According to the embodiments of the present invention, the resist film having the opening exposing the upper surface of the insulating layer of parts corresponding to areas where the wiring is to be formed is formed on the upper surface of the insulating layer. Then, the metal layer is formed so as to cover an upper surface of the resist film, a side surface of the resist film forming the openings for forming the wirings and the upper surface of the insulating layer. After that, the openings for forming the wirings are filled with the plating film by an electrolytic plating method where the metal layer is a feeding layer. Then, the plating film and the metal layer formed above the upper surface of the resist film are removed so that the wirings are formed. After that, the resist film is removed. The wirings can be formed without using the etching method and therefore it is possible to make the wirings have the designated width (width in design).

Thus, according to the embodiments of the present invention, it is possible to provide a manufacturing method of a wiring board whereby a wirings having a designated width (width in design) can be formed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiment of the present invention has been described in detail, it should be understood that the various changes, substitutions, and alterations could be made hereto without departing from the spirit and scope of the invention.

This patent application is based on Japanese Priority Patent Application No. 2008-19261 filed on Jan. 30, 2008, the entire contents of which are hereby incorporated herein by reference.

What is claimed is:

1. A manufacturing method of a wiring board, the wiring board including an insulating layer and a wiring formed on an upper surface of the insulating layer, the manufacturing method comprising:
   forming a sticking layer, of which material is a Ni—Cu alloy, for covering the upper surface of the insulating layer;
   forming a resist film on an upper surface of the sticking layer, the resist film having an opening for forming the wiring, the opening exposing the upper surface of the sticking layer of a part corresponding to an area where the wiring is to be formed;
   forming a protection metal layer, of which material is a Ni—Cu alloy having a content of Ni greater than that of the Ni—Cu alloy being the material of the sticking layer, the protection metal layer being configured to be more difficult to be etched than the sticking layer, to cover an upper surface of the resist film, and to cover a side surface of the resist film and the upper surface of the sticking layer which forms the opening for forming the wiring;
   forming a seed layer to be a feed layer for forming a plating film;
   filling with the plating film the opening for forming the wiring, by an electrolytic plating method where the seed layer is the feeding layer;
   removing the plating film, the seed layer and the protection metal layer formed above the upper surface of the resist film;
   removing the resist film after the removing of the plating film, the seed layer and the protection metal layer; and
   removing the sticking layer of an unnecessary part not covered with the metal layer, after the removing of the resist film.

2. The manufacturing method of the wiring board as claimed in claim 1,
   wherein, in the forming of the protection metal layer, the protection metal layer is formed to have a thickness sufficient to cause the protection metal layer to remain on the side wall of the plating film after the sticking layer is removed.

3. The manufacturing method of the wiring board as claimed in claim 1, further comprising:
   forming a pad under the insulating layer at a part positioned under the wiring; and
   forming a via forming part in the insulating layer of a part positioned between the wiring and the pad, the via forming part being connected to the wiring and the pad.

* * * * *